(12) United States Patent
Satou et al.

(10) Patent No.: US 9,628,084 B2
(45) Date of Patent: Apr. 18, 2017

(54) RECONFIGURABLE LOGIC DEVICE

(71) Applicant: Taiyo Yuden Co., Ltd., Tokyo (JP)

(72) Inventors: Masayuki Satou, Tokyo (JP); Isao Shimizu, Saitama (JP)

( * ) Notice: Subject to any disclaimer, the term of this patent is extended or adjusted under 35 U.S.C. 154(b) by 0 days.

(21) Appl. No.: 15/046,777

(22) Filed: Mar. 8, 2016

(65) Prior Publication Data

US 2016/0241245 A1    Aug. 18, 2016

(30) Foreign Application Priority Data

Feb. 18, 2015    (JP) .................. 2015-029218

(51) Int. Cl.
*H03K 19/177* (2006.01)
*G06F 7/38* (2006.01)

(52) U.S. Cl.
CPC ... *H03K 19/1776* (2013.01); *H03K 19/17728* (2013.01); *H03K 19/17736* (2013.01)

(58) Field of Classification Search
CPC ......... H03K 19/1776; H03K 19/17728; H03K 19/17736
USPC ............................................ 326/40, 38, 46
See application file for complete search history.

(56) References Cited

U.S. PATENT DOCUMENTS

| | | | | |
|---|---|---|---|---|
| 9,350,357 B2 * | 5/2016 | Sato | ................... | H03K 19/1776 |
| 9,425,800 B2 * | 8/2016 | Sato | ................. | H03K 19/17728 |
| 2009/0154282 A1 | 6/2009 | Satoh | | |
| 2015/0280717 A1 * | 10/2015 | Sato | ................... | H03K 19/1776 326/41 |
| 2016/0036447 A1 * | 2/2016 | Sato | ................. | H03K 19/17728 326/38 |
| 2016/0241245 A1 * | 8/2016 | Satou | ................. | H03K 19/1776 |

FOREIGN PATENT DOCUMENTS

| | | | |
|---|---|---|---|
| JP | 2002-538652 | A | 11/2002 |
| WO | 00/51239 | A | 8/2000 |
| WO | 2007/060763 | A | 5/2007 |
| WO | 2014/163099 | A | 10/2014 |

* cited by examiner

*Primary Examiner* — Daniel D Chang
(74) *Attorney, Agent, or Firm* — Chip Law Group

(57) ABSTRACT

A reconfigurable logic device includes logic units and allows logic circuits to be formed according to configuration data. The logic units each include a configuration memory that stores first and second configuration data, a first address input line through which a clock is inputted as a first address for the configuration memory, a second address input line through which an input of a data input line is inputted as a second address for the configuration memory, a register unit that, according to the clock, reads the second configuration data specified by the first address from the configuration memory and retains the second configuration data, and outputs the first configuration data in a previous state, and a multiplexer that, according to the first or second configuration data outputted from the register unit, selectively combines a data input from the data input line and a data output to a data output line.

11 Claims, 28 Drawing Sheets

| A0 | A1 | A2 | A3 | D0 | D1 | D2 | D3 |
|----|----|----|----|----|----|----|----|
| 0  | 0  | 0  | 0  | 0  | *  | *  | *  |
| 1  | 0  | 0  | 0  | 1  | *  | *  | *  |
| 0  | 1  | 0  | 0  | 1  | *  | *  | *  |
| 1  | 1  | 0  | 0  | 1  | *  | *  | *  |
| 0  | 0  | 1  | 0  | 0  | *  | *  | *  |
| 1  | 0  | 1  | 0  | 1  | *  | *  | *  |
| 0  | 1  | 1  | 0  | 1  | *  | *  | *  |
| 1  | 1  | 1  | 0  | 1  | *  | *  | *  |
| 0  | 0  | 0  | 1  | 0  | *  | *  | *  |
| 1  | 0  | 0  | 1  | 1  | *  | *  | *  |
| 0  | 1  | 0  | 1  | 1  | *  | *  | *  |
| 1  | 1  | 0  | 1  | 1  | *  | *  | *  |
| 0  | 0  | 1  | 1  | 1  | *  | *  | *  |
| 1  | 0  | 1  | 1  | 1  | *  | *  | *  |
| 0  | 1  | 1  | 1  | 1  | *  | *  | *  |
| 1  | 1  | 1  | 1  | 1  | *  | *  | *  |

A0 → D1
A1 → D2
A2 → D3
A3 → D0

| A0 | A1 | A2 | A3 | D0 | D1 | D2 | D3 |
|----|----|----|----|----|----|----|----|
| 0  | 0  | 0  | 0  | 0  | 0  | 0  | 0  |
| 1  | 0  | 0  | 0  | 0  | 1  | 0  | 0  |
| 0  | 1  | 0  | 0  | 0  | 0  | 1  | 0  |
| 1  | 1  | 0  | 0  | 0  | 1  | 1  | 0  |
| 0  | 0  | 1  | 0  | 0  | 0  | 0  | 1  |
| 1  | 0  | 1  | 0  | 0  | 1  | 0  | 1  |
| 0  | 1  | 1  | 0  | 0  | 0  | 1  | 1  |
| 1  | 1  | 1  | 0  | 0  | 1  | 1  | 1  |
| 0  | 0  | 0  | 1  | 1  | 0  | 0  | 0  |
| 1  | 0  | 0  | 1  | 1  | 1  | 0  | 0  |
| 0  | 1  | 0  | 1  | 1  | 0  | 1  | 0  |
| 1  | 1  | 0  | 1  | 1  | 1  | 1  | 0  |
| 0  | 0  | 1  | 1  | 1  | 0  | 0  | 1  |
| 1  | 0  | 1  | 1  | 1  | 1  | 0  | 1  |
| 0  | 1  | 1  | 1  | 1  | 0  | 1  | 1  |
| 1  | 1  | 1  | 1  | 1  | 1  | 1  | 1  |

| A0 | A1 | A2 | A3 | D0 | D1 | D2 | D3 |
|---|---|---|---|---|---|---|---|
| 0 | 0 | 0 | 0 | 0 | * | 0 | * |
| 1 | 0 | 0 | 0 | 0 | * | 0 | * |
| 0 | 1 | 0 | 0 | 0 | * | 0 | * |
| 1 | 1 | 0 | 0 | 1 | * | 0 | * |
| 0 | 0 | 1 | 0 | 0 | * | 0 | * |
| 1 | 0 | 1 | 0 | 0 | * | 0 | * |
| 0 | 1 | 1 | 0 | 0 | * | 0 | * |
| 1 | 1 | 1 | 0 | 0 | * | 0 | * |
| 0 | 0 | 0 | 1 | 0 | * | 1 | * |
| 1 | 0 | 0 | 1 | 0 | * | 1 | * |
| 0 | 1 | 0 | 1 | 0 | * | 1 | * |
| 1 | 1 | 0 | 1 | 1 | * | 1 | * |
| 0 | 0 | 1 | 1 | 0 | * | 1 | * |
| 1 | 0 | 1 | 1 | 0 | * | 1 | * |
| 0 | 1 | 1 | 1 | 0 | * | 1 | * |
| 1 | 1 | 1 | 1 | 0 | * | 1 | * |

RECONFIGURABLE LOGIC DEVICE

CROSS REFERENCE TO RELATED APPLICATION(S)

This application is based upon and claims benefit of priority from Japanese Patent Application No. 2015-029218, filed on Feb. 18, 2015, the entire contents of which are incorporated herein by reference.

BACKGROUND

The present invention relates to a reconfigurable logic device.

Reconfigurable (programmable or writable) semiconductor devices such as field-programmable gate arrays (FPGAs) are widely used because of the flexibility provided by their rewritability (e.g. JP 2002-538652T).

A common island style FPGA is composed of logic-element configurable logic blocks (CLBs), switch elements SB and CB, and input/output elements IOB.

The logic element CLB is a programmable element that creates a combinational circuit, and each CLB is formed of a data flip-flop (DFF), a look-up table (LUT), etc. In a k-input LUT (k-LUT), 2 raised to the k-th power of static random access memory (SRAM) cells are used, and a function with k variables is created, such as a system in which the truth table of any logic function is retained in the SRAM and output is performed by referencing the truth table according to the input.

In order to bring about a signal path between CLBs linking the logic function portions, the switch elements CB and SB capable of switching the signal path are placed between the CLBs. The switch element CB is an element that switches between a logic block LB and a wiring channel, and the switch element SB is an element that switches between vertical and horizontal wirings in a portion where the vertical and horizontal wirings cross.

The input/output element IOB is a component that plays the role of an interface between the input/output of the device and the logic block LB.

The present applicant or the present inventors have developed an "MPLD™ (Memory-based Programmable Logic Device)" that creates a circuit configuration by means of memory cell units. The MPLD is illustrated in, for example, WO 2007/060763. The MPLD interconnects memory arrays called multi look-up tables (MLUTs). The MLUT stores truth value data, and forms a wiring circuit and a logic circuit. The MPLD has achieved a function almost equivalent to the FPGA by arranging these MLUTs in an array configuration and interconnecting them. The MPLD is a device enabling a flexible logic area and wiring area by using the MLUT as both a logic circuit and a wiring circuit by means of truth table data (e.g. WO 2007/060763), and is different from the FPGA, which includes a dedicated switching circuit for the connection between memory cell units.

WO 2014/163099 discloses an MLUT 30 in which a reconfigurable logic multiplexer 50 is used for data input/output and truth value data is used for the select control signal of the reconfigurable logic multiplexer 50. In the Example, an ATD circuit 200 is used for the synchronization/asynchronization of the MLUT.

SUMMARY

The FPGA is a reconfigurable device as described above, but is larger in area than an application-specific integrated circuit (ASIC) due to the wiring and the switch, which account for approximately 70% to 80% of the total area. Furthermore, in the FPGA, there are restrictions on reconfiguration because the logic element and the wiring element are created by devices different from each other.

The address transition data (ATD) circuit illustrated in WO 2014/163099 is a special circuit, and needs consideration such as timing adjustment for use in common logic designs.

According to an embodiment of the present invention, there is provided a reconfigurable logic device capable of switching between synchronization and asynchronization without needing an ATD circuit.

Embodiments to solve the issues mentioned above are illustrated by the following item set:

1. A reconfigurable logic device including a plurality of logic units and configured to allow a plurality of logic circuits to be formed in accordance with configuration data,
   wherein each of the logic units includes
   a configuration memory configured to store first configuration data and second configuration data,
   a data input line,
   a data output line,
   a first address input line through which a clock is inputted as a first address for the configuration memory,
   a second address input line through which an input of the data input line is inputted as a second address for the configuration memory,
   a register unit configured to, in accordance with the clock, read the second configuration data specified by the first address from the configuration memory and retain the second configuration data, and output the first configuration data retained in a previous state, and
   a reconfigurable logic multiplexer configured to, in accordance with the first configuration data or the second configuration data outputted from the register unit, selectively combine a data input from the data input line and a data output to the data output line, and/or output, to the data output line, data produced by a logical operation related to a data input from the data input line, and
   wherein adjacent ones of the logic units are connected by the data input line and the data output line.

The register unit forms a D-type flip-flop that retains or outputs configuration data in accordance with the clock. Thereby, the logic unit can perform a synchronous operation in accordance with the clock. When the first configuration data in the previous state and the second configuration data are different, the output does not change even when the clock has changed; therefore, the logic unit can perform an asynchronous operation.

2. The reconfigurable logic device according to item 1,
   wherein the first address is a signal obtained by multiplying a frequency of a system clock by n (n being an integer of 2 or more),
   wherein each of the logic units further includes a third address input line through which the system clock is inputted as a third address for the configuration memory, and
   wherein the register unit
   reads data from the configuration memory in each of an earlier period and a later period of the first address and encodes the data, and
   outputs the encoded data to the reconfigurable logic multiplexer.

Since the address space of the configuration memory extends along the row, application is possible even to a memory with a narrow data width.

3. The reconfigurable logic device according to item 1 or 2, wherein the logic unit is a multi look-up table.

4. The reconfigurable logic device according to any one of items 1 to 3, wherein the first configuration data and the second configuration data each include a plurality of pieces of truth table data that determine a logical operation value and/or a line linkage path and are configured such that any one of the plurality of pieces of truth table data is selected in accordance with the data input.

5. The reconfigurable logic device according to any one of items 1 to 4, wherein a plurality of the reconfigurable logic multiplexers are present and each is provided for each combination of a direction of the data input line and a direction of the data output line.

6. The reconfigurable logic device according to any one of items 1 to 5, wherein the configuration memory is prepared for each data output direction.

7. The reconfigurable logic device according to any one of items 1 to 6, wherein each of the logic units further includes a fourth address input line through which a fourth address for the configuration memory is inputted, and wherein the configuration memory stores a plurality of sets of the first configuration data or the second configuration data and is configured such that any one of the plurality of sets of the first configuration data or the second configuration data is outputted to a fourth data output line connected to the fourth address input line and the plurality of pieces of truth table data are specified in accordance with an input of the fourth address input line.

8. A control method for a reconfigurable logic device including a plurality of logic units and configured to allow a plurality of logic circuits to be formed in accordance with configuration data, each of the logic units including a configuration memory configured to store first configuration data and second configuration data, a data input line, a data output line, a first address input line through which a clock is inputted as a first address for the configuration memory, a second address input line through which an input of the data input line is inputted as a second address for the configuration memory, a register unit configured to retain the first configuration data or the second configuration data, and a reconfigurable logic multiplexer, the control method including:

connecting adjacent ones of the logic units by the data input line and the data output line;

reading, by the register unit, in accordance with the clock, the second configuration data specified by the first address from the configuration memory and retaining the second configuration data, and outputting the first configuration data retained in a previous state; and selectively combining, by the reconfigurable logic multiplexer, in accordance with the first configuration data or the second configuration data outputted from the register unit, a data input from the data input line and a data output to the data output line, and/or outputting, to the data output line, data produced by a logical operation related to a data input from the data input line.

9. The control method according to item 8, wherein the first address is a signal obtained by multiplying a frequency of a system clock by n (n being an integer of 2 or more), wherein each of the logic units further includes a third address input line through which the system clock is inputted as a third address for the configuration memory, and wherein the register unit reads data from the configuration memory in each of an earlier period and a later period of the first address and encodes the data, and outputs the encoded data to the reconfigurable logic multiplexer.

10. The control method according to item 8 or 9, wherein the logic unit is a multi look-up table.

11. A program for controlling a reconfigurable logic device including a plurality of logic units and configured to allow a plurality of logic circuits to be formed in accordance with configuration data, each of the logic units including a configuration memory configured to store first configuration data and second configuration data, a data input line, a data output line, a first address input line through which a clock is inputted as a first address for the configuration memory, a second address input line through which an input of the data input line is inputted as a second address for the configuration memory, a register unit configured to retain the first configuration data or the second configuration data, and a reconfigurable logic multiplexer, the program causing:

the data input line and the data output line to connect adjacent ones of the logic units;

the register unit to read, in accordance with the clock, the second configuration data specified by the first address from the configuration memory and retain the second configuration data, and output the first configuration data retained in a previous state; and the reconfigurable logic multiplexer to selectively combine a data input from the data input line and a data output to the data output line, and/or output, to the data output line, data produced by a logical operation related to a data input from the data input line.

12. A storage medium configured to store the program according to item 11.

According to an embodiment of the present invention, it is possible to provide a reconfigurable logic device capable of switching between synchronization and asynchronization without needing an ATD circuit.

BRIEF DESCRIPTION OF THE DRAWINGS

FIG. 20A is a diagram showing an example of configuration data stored in a configuration memory on a left side of an MLUT 30A;

FIG. 20B is a diagram showing an example of configuration data stored in a configuration memory on a right side of the MLUT 30A;

FIG. 20C is a diagram showing an example of configuration data stored in a configuration memory on a left side of an MLUT 30B;

FIG. 20D is a diagram showing an example of configuration data stored in a configuration memory on a right side of the MLUT 30B;

FIG. 20E is a diagram showing an example of configuration data stored in a configuration memory on a left side of an MLUT 30C;

FIG. 20F is a diagram showing an example of configuration data stored in a configuration memory on a right side of the MLUT 30C;

FIG. 20G is a diagram showing an example of configuration data stored in a configuration memory on a left side of an MLUT 30D;

FIG. 20H is a diagram showing an example of configuration data stored in a configuration memory on a right side of the MLUT 30D;

FIG. 20I is a diagram showing an example of configuration data stored in a configuration memory on a left side of an MLUT 30E;

FIG. 20J is a diagram showing an example of configuration data stored in a configuration memory on a right side of the MLUT 30E;

FIG. 20K is a diagram showing an example of configuration data stored in a configuration memory on a left side of an MLUT 30F;

FIG. 20L is a diagram showing an example of configuration data stored in a configuration memory on a right side of the MLUT 30F.

DETAILED DESCRIPTION OF THE EMBODIMENT(S)

Figure 1:
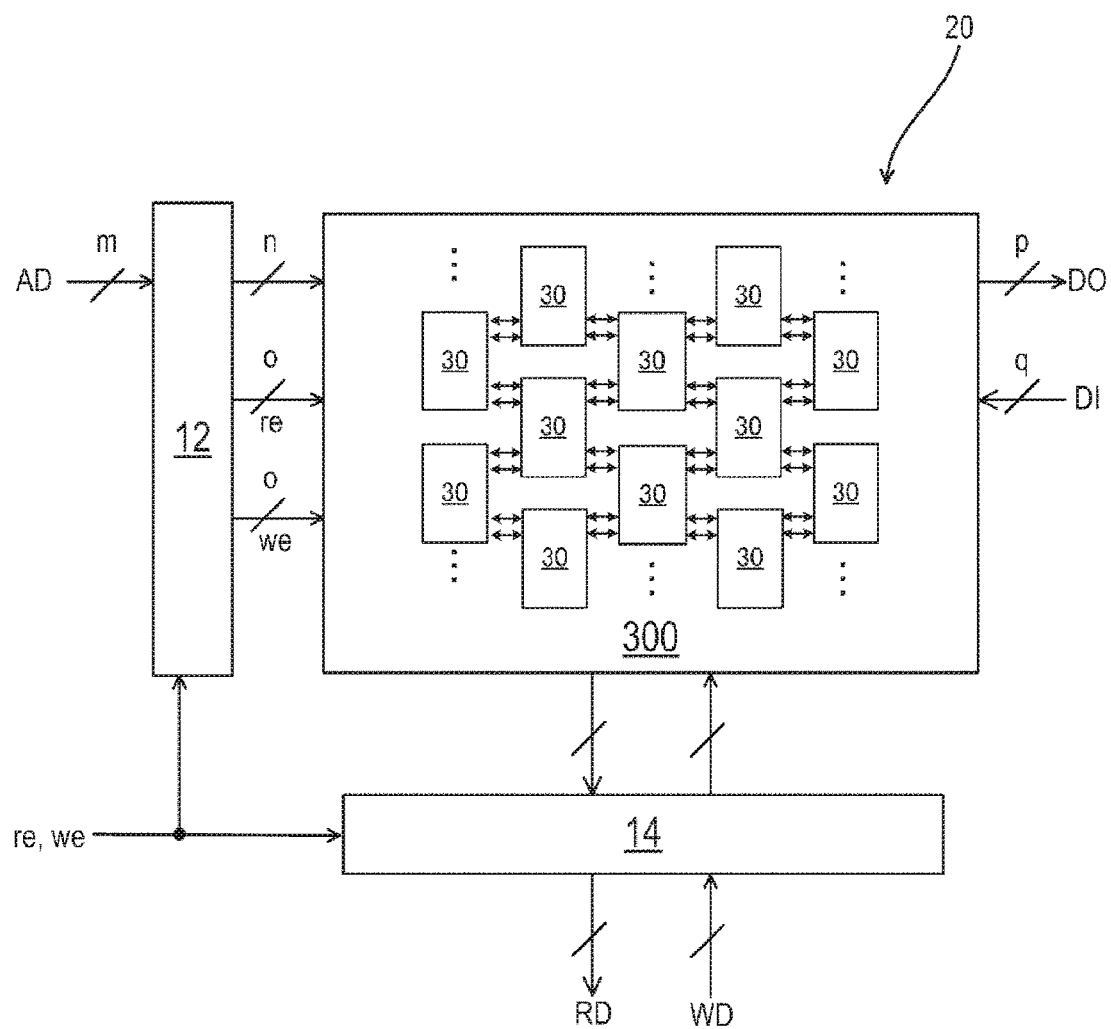
FIG. 1 is a diagram showing an example of an overall configuration of a semiconductor device according to an embodiment.

Hereinafter, referring to the appended drawings, preferred embodiments of the present invention will be described in detail. It should be noted that, in this specification and the appended drawings, structural elements that have substantially the same function and structure are denoted with the same reference numerals, and repeated explanation thereof is omitted.

Hereinbelow, 1. Reconfigurable Logic Device, 2. MLUT Array, 3. MLUT, 4. Page Control, 5. Configuration Data, and 6. Method for Creating Configuration Data will be sequentially described with reference to the drawings.

1. Reconfigurable Logic Device

FIG. 1 is a diagram showing an example of a reconfigurable logic device according to an embodiment. Hereinafter, the reconfigurable logic device will be referred to as the MRLD™ (Memory-based Reconfigurable Logic Device).

The MRLD is a device having a reconfiguration function almost equivalent to that of the FPGA, but the structure is different. The FPGA is composed of configurable logic blocks (CLBs), switch blocks, and connection blocks, and the proportion between the logic resources and the wiring resources is fixed. In contrast, the MRLD differs from the FPGA in that the MRLD has a configuration in which MLUTs usable as both a logic element and a wiring element are arranged and the MLUTs are directly connected.

An MRLD 20 shown in FIG. 1 includes an MLUT array 300 in which a plurality of multi look-up tables (MLUTs) 30 described later in detail are arranged in an array configuration, a decoder 12 that specifies the memory read operation and write operation of the MLUT, and an input/output unit 14.

In the logical operation of the MRLD 20, signals of a data input DI and a data output DO indicated by the solid line are used. The data input DI is used as an input of data input lines (InA0 to InA3, and InB0 to InB3) for an input signal of a logic circuit. The data output DO is used as an output of data output lines (OutA0 to OutA3, and OutB0 to OutB3) for an output signal of a logic circuit (details of the data input lines are described later in FIG. 5).

The logic created by the logical operation of the MRLD 20 is created by truth table data stored in the MLUT 30. Some MLUTs 30 operate as a logic circuit serving as a combinational circuit such as an AND circuit, an adder, etc. The other MLUTs operate as a connection circuit that makes a connection between the MLUTs 30 that create the combinational circuit. The rewriting of the truth table data for the MRLD 20 to create the logic circuit and the connection circuit is performed by the write operation to the configuration memory of the MLUT 30.

The write operation to the MRLD 20 is performed by an address for writing AD and data for writing WD, and the read operation is performed by the address for writing AD and data for reading RD.

The address for writing AD is an address that specifies the memory cell in the MLUT 30. The address for writing AD specifies 2 raised to the m-th power×n of memory cells by means of m signal lines. The address for writing AD is used in both cases of the read operation and the write operation of the memory, is decoded by the decoder 12 via the m signal lines, and selects the memory cell as an object. In the embodiment, as described later, the decoding of the data input DI is performed by a decoder in the MLUT 30.

The decoder 12 decodes the address for writing AD in accordance with control signals such as a read enable signal re and a write enable signal we, and outputs a decoded address n to the MLUT 30. The decoded address n is used as an address that specifies the memory cell in the configuration memory of the MLUT 30.

The input/output unit 14 writes the data for writing WD in accordance with the write enable signal we, and outputs the data for reading RD in accordance with the read enable signal re.

2. MLUT Array

Figure 2:
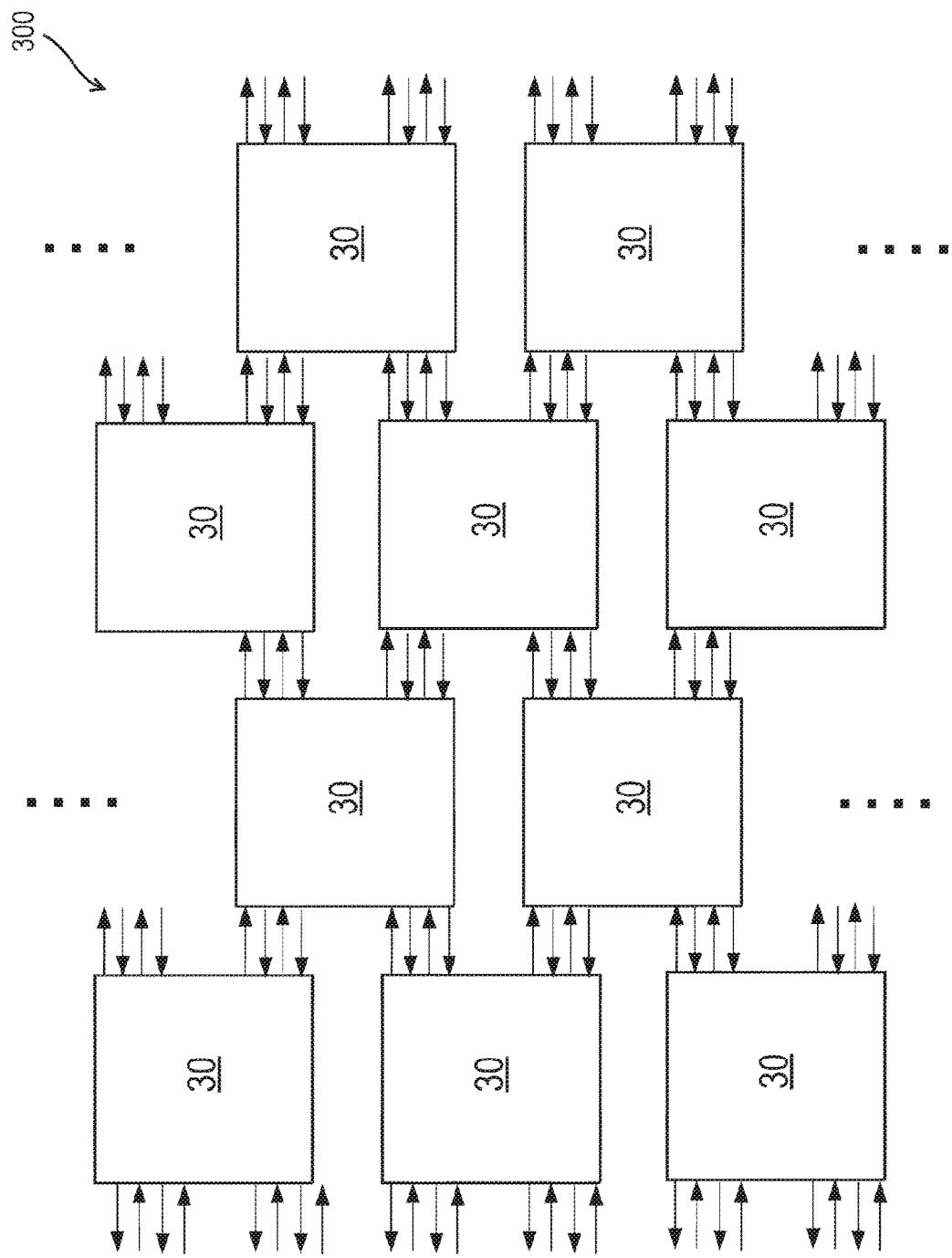
FIG. 2 is a diagram showing an example of an MLUT array of an alternating arrangement.

FIG. 2 is a diagram describing an example of the MLUT array of an alternating arrangement. Each arrow shown in FIG. 2 is a data input line or a data output line connected to another adjacent MLUT. The data input line is used as an address input line of an address (described later in FIG. 5), and the data output line is used to output data. In the MLUT array 300 shown in FIG. 2, the MLUT 30 is connected to another adjacent MLUT 30 by two data input lines or data output lines. In other words, the MLUTs are connected to each other by a plurality of data input lines or data output lines. Each of the adjacent MLUTs is connected to two MLUTs in each of the input direction and the output direction in order to enhance reconfigurability. This arrangement will be hereinafter referred to as the "alternating arrangement".

The arrows shown in FIG. 2 indicate the data output directions. Although in FIG. 2 there are bidirectional data flows from the left to the right and from the right to the left, the data flow may be unidirectional.

The alternating arrangement-type MLUT makes multi-bit data processing possible by using a plurality of data input lines and data output lines connected to another adjacent MLUT, and facilitates the creation of a logic library because the direction of the flow of data in the input and output directions can be limited.

Figure 3:
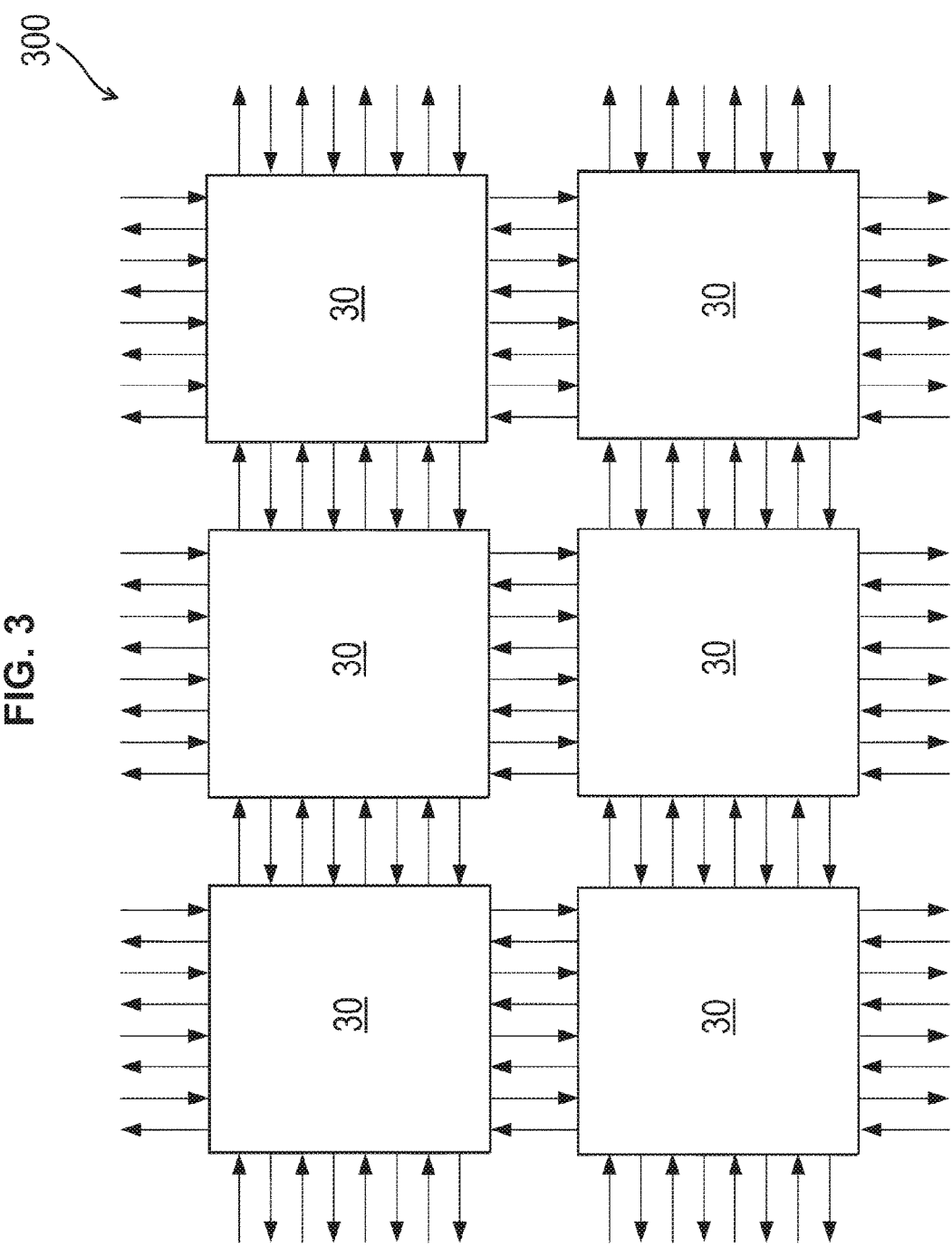
FIG. 3 is a diagram showing an example of an MLUT array of a four-direction arrangement.

FIG. 3 is a diagram describing an example of the MLUT array of a four-direction arrangement. The four-direction arrangement shown in FIG. 3 is an arrangement similar to that of the FPGA. This configuration makes it possible to employ a configuration similar to that of the FPGA, and facilitates the creation of the configuration data of the MRLD by using a logically configured state created with an FPGA tool. For example, configuring the upper left, the middle above, and the lower left of the drawing as switch blocks and the lower right as an LUT block can express an equivalent to the CLB of the FPGA, and create truth value data from the logically configured state of the FPGA.

3. MLUT

Figure 4:
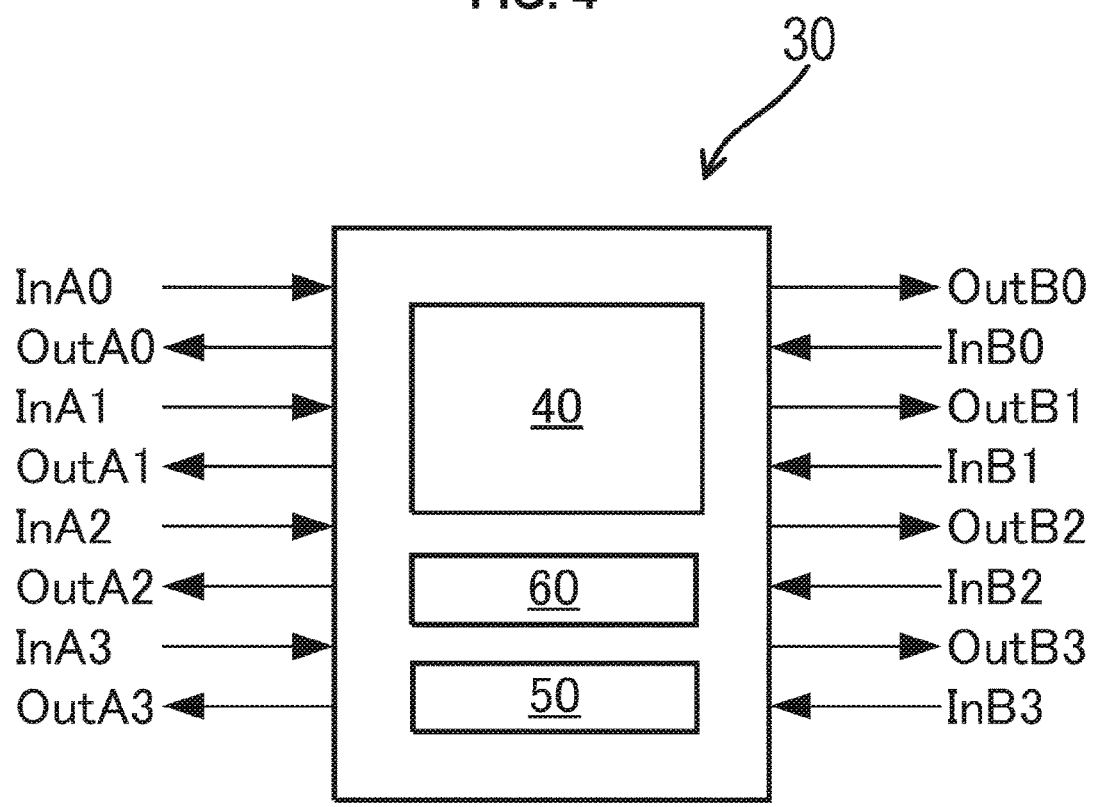
FIG. 4 is a diagram showing an arrangement example of signal lines of the MULT of the alternating arrangement.

FIG. 4 is a diagram showing an arrangement example of signal lines of the MLUT of the alternating arrangement. The MLUT 30 includes a configuration memory 40 that stores first configuration data and second configuration data, data input lines (InA0 to InA3, and InB0 to InB3), data output lines (OutA0 to OutA3, and OutB0 to OutB3), a first address input line through which a clock is inputted as a first address for the configuration memory (described later in FIG. 5), a second address input line through which an input of the data input line is inputted as a second address for the configuration memory (described later in FIG. 5), a register unit 60 that, in accordance with the clock, reads the second configuration data specified by the first address from the configuration memory and retains the second configuration data, and outputs the first configuration data retained in the previous state, and a reconfigurable logic multiplexer 50 that, in accordance with the first configuration data or the second configuration data outputted from the register unit, selectively combines a data input from the data input line and a data output to the data output line, and/or outputs, to the data output line, data produced by a logical operation related to a data input from the data input line.

The first configuration data and the second configuration data are each constructed by truth table data.

Figure 5:
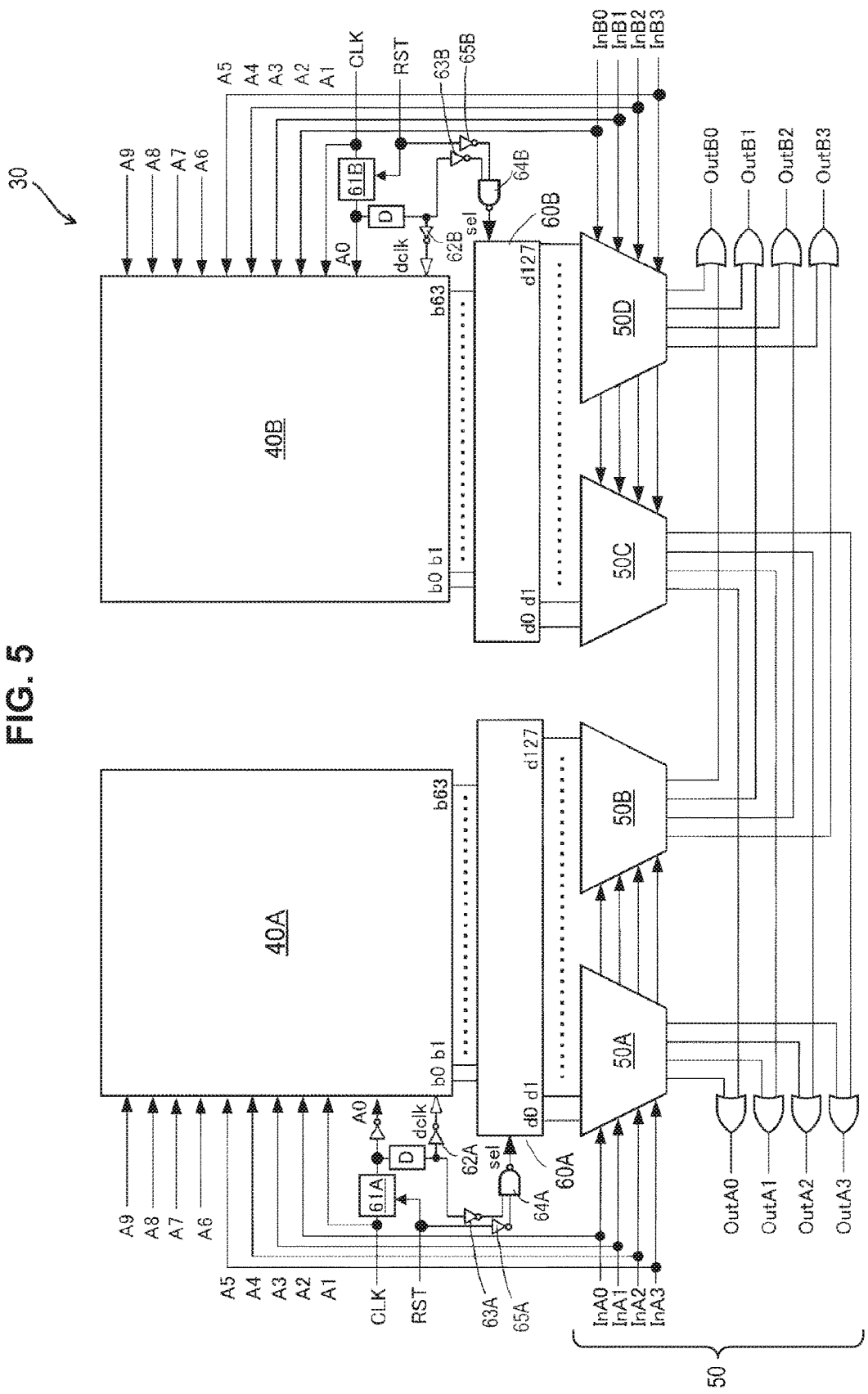
FIG. 5 is a diagram showing an example of the MLUT of the alternating arrangement.

FIG. 5 is a diagram showing an example of the MLUT of the alternating arrangement. The MLUT 30 shown in FIG. 5 includes two configuration memories 40A and 40B in order to prevent an increase in memory capacity due to an increase in the number of addresses. Although two configuration memories are shown in FIG. 5, a single configuration memory alone can be sufficient.

The data input/output lines (InA0 to InA3, InB0 to InB3, OutA0 to OutA3, and OutB0 to OutB3) of the MLUT shown in FIG. 5 are the same as the signal lines of the MLUT shown in FIG. 4.

Meanwhile, in the embodiment, four types of address lines are input to the configuration memory 40. A first address line is an input line of a signal obtained by multiplying the frequency of a system clock signal, and is used as a clock. A second address line is an input line connected to the data input lines (InA0 to InA3) of the reconfigurable logic multiplexer 50. A third address line is an input line of a system clock signal. A fourth address line is an input line of a page (truth table data) switching signal. On the other hand, as another embodiment, a configuration with no third address line may be employed by using the system clock simply as the signal of the first address line.

3.1 Configuration Memory

Figure 6:
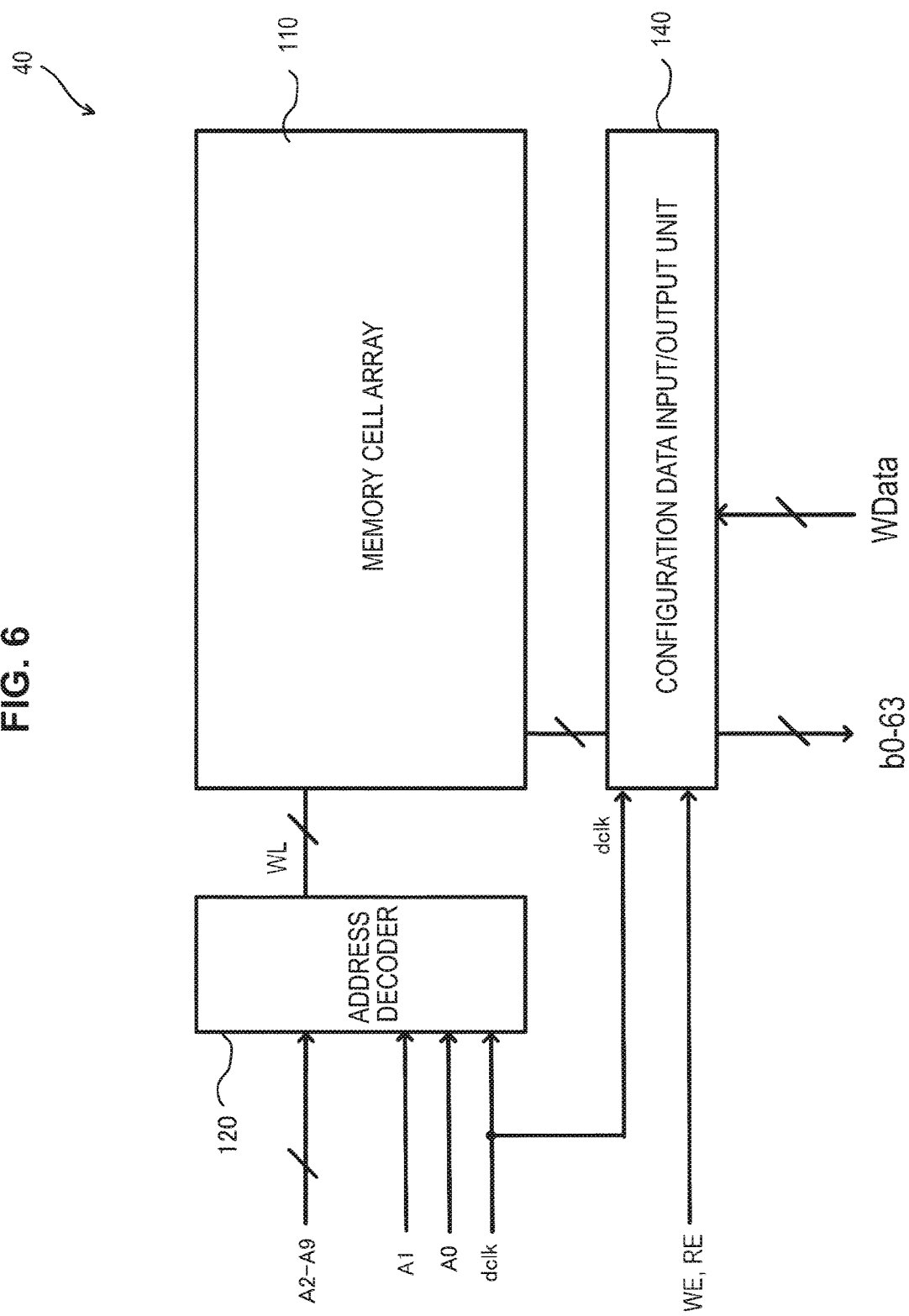
FIG. 6 is a diagram showing an example of a configuration memory.

FIG. 6 is a diagram showing the configuration memory in detail. The configuration memory 40 is SRAM, for example, and is synchronous memory that operates in synchronization with a clock. The configuration memory 40 is connected to a plurality of address lines for specifying a memory cell that stores configuration data.

A memory cell array 110 includes n×2$^m$ memory cells (accompanying storage elements), and the memory cells are placed in portions where 2 raised to the m-th power of word lines and n bit lines (also referred to as "data lines", the same applies hereinafter) are connected.

When an address decoder 120 has received address signals from m address signal lines in synchronization with a clock (dclk), the address decoder 120 decodes the address signals and outputs word line select signals, which are the decoded signals, to 2 raised to the m-th power of word lines WL to perform data read or write processing from or to the corresponding memory cell.

A configuration data input/output unit 140 includes a write amplifier and, as necessary, a sense amplifier. When, for example, the write amplifier receives the rising edge timing of a write enable (WE) and write data from the outside, the write amplifier transmits the signal level of the write data to n bit lines b0 to b63 to write the data to the memory cells.

The configuration memory shown in FIG. 6 may be provided for each of the directions of wiring. For example, there are two configuration memories in the alternating arrangement shown in FIG. 2, and there are four configuration memories in the four-direction arrangement shown in FIG. 3. Thus, by providing the configuration memory for each direction, the number of addresses is decreased as compared to the case of being configured by a single memory (2 raised to the 10th power×4 is smaller than 2 raised to the 40th power), and the capacity of the memory can therefore be reduced.

3.1.1 Bit Width of Configuration Memory

In the embodiment, the configuration memories 40A and 40B store data (b0 to b63) with a data width of half the data width (d0 to d127) of the register units 60A and 60B. Each of the configuration memories 40A and 40B is a synchronous memory that synchronizes in accordance with a device clock dclk described later.

3.1.2 First Address Line and Third Address Line

A description will now be given using FIG. 5 again. In FIG. 5, the third address line A1 is for a system clock signal of the MLUT 30. The first address line is for a signal obtained by multiplying the frequency of the system clock signal by n (n being an integer of 2 or more) with multiplier circuits 61A and 61B. Thereby, the address area to be read can be changed and data can be read within a cycle of the system clock frequency, and meanwhile the data area of the memory is increased by n times in the row direction. Employing such a configuration can extend the data area of the configuration memory in the address direction.

In the example shown in FIG. 5, the data width of the register units 60A and 60B is "d0 to d127", which is 128 bits. Meanwhile, the data width of the configuration memories 40A and 40B is "b0 to b63", which is 64 bits. This means that, since the first address A0 has been made into a high frequency by multiplying the first address A0 by 2, the configuration memories 40A and 40B output data twice within a cycle of the system clock of the MLUT 30.

In FIG. 5, a configuration with no third address line may be employed by using the system clock only to generate the signal of the first address line. In this case, the configuration memory 40 includes 128-bit bit lines. The register units 60A and 60B described later include 128-bit data inputs, and do not have an encoder function.

3.1.3 First Address Generation Circuit (62A and 62B)

Each of the multiplier circuits 61A and 61B is a circuit that multiplies the frequency of the input signal by n as described above. The output signals of the multiplier circuits 61A and 61B are inverted by inverters 62A and 62B, and are used as the device clocks dclk of the configuration memories 40A and 40B. Although described later using FIG. 7, the device clock dclk is inverted because the reading of data is performed twice within a system clock cycle by reading data from the configuration memories 40A and 40B at the rising and falling of the device clock dclk in association with the first address line A0.

3.1.4 Register Clock (Sel) Generation Circuit

A register clock sel is a signal that operates on the same cycle as the device clock dclk, and is used as a clock signal for register unit operation. The register clock sel is generated by NAND (negative logical product) circuits 64A and 64B. When both input signals to the NAND circuits 64A and 64B are "High", "Low" is outputted; otherwise, "High" is outputted. One of the input signals is the output signal of a reset signal RST. The reset signal is "Low" during a reset, and thus is inverted by inverters 65A and 65B, and "High" is outputted to the NAND circuits 64A and 64B. The other input signal to the NAND circuits 64A and 64B is a signal obtained by delaying a signal by a delay circuit D and inverting the delayed signal by inverters 63A and 63B, similarly to the device clock dclk. Therefore, the resister clock sel, which is the output of the NAND circuits 64A and 64B, operates on the same cycle as the device clock dclk.

3.1.5 Register Unit

A. Synchronous Operation or Asynchronous Operation by First Address

The register units 60A and 60B, in accordance with the register clock, read the second configuration data specified by the first address from the configuration memory and retain the second configuration data, and output the first configuration data retained in the previous state.

The register units 60A and 60B are formed of a register element that operates on a register clock, and form a D-type flip-flop that retains or outputs the configuration data in accordance with the register clock. The register units 60A and 60B cause the register element to retain, as a Q output, the value of the data input read from the configuration memory. The configuration of the register units 60A and 60B allows the logic unit (MLUT) 30 to perform a synchronous operation in accordance with a clock.

B. Encoder Function by Third Address

In the case where the third address A1 is inputted, the register units 60A and 60B have an encode function of retaining and encoding data in accordance with the "High" as a later period of the first address and "Low" as an earlier period of the first address and outputting the encoded data to the reconfigurable logic multiplexer 50. For example, when the sel signal is "Low", b0 to b63 are set to d0 to d63; when the sel signal is "High", b0 to b63 are set to d64 to d127; thus, 128 bits are encoded and outputted to the reconfigurable logic multiplexer 50.

3.1.6 Reconfigurable Logic Multiplexer

The reconfigurable logic multiplexer 50, in accordance with the first configuration data and the second configuration data outputted from the register unit, selectively combines a data input from the data input line and a data output to the data output line, and/or outputs, to the data output line, data produced by a logical operation related to a data input of the data input line.

In the embodiment, the data outputted from the register unit 60 is taken as an "input signal" to the multiplexer, and the data inputs (InA0 to InA3, and InB0 to InB3) are taken as a "select control signal". The selected data is outputted to the data output lines (OutA0 to OutA3, and OutB0 to OutB3).

The reconfigurable logic multiplexer 50 is formed of a multiplexer that selects the input signal by means of the select control signal and outputs data, as shown in FIG. 5.

Since 16 combinations of four inputs in the MLUT 30 are possible, 16 registers (16 bit lines) are needed for one input. The number of registers of the register unit 60 is determined also by the number of input/output directions. When the data flow is bidirectional, data of from the left to the left", from the left to the right", from the right to the left", and from the right to the right" is needed, resulting in 4 bits×16×4, that is, 256 registers and 256 bit lines. Reconfigurable logic multiplexers 50A, 50B, 50C, and 50D are prepared in accordance with the input/output direction of data.

In the embodiment, since a configuration in which a clock signal is used to enlarge the configuration memory in the row direction and reduce the number of bits is employed, the number of bits of the configuration memory is 64×2, that is, 128 bits, which is relatively small.

A. Creation of Logic Function

The configuration data is expressed by "16-bit combinations"×"4-bit data inputs" as values corresponding to the truth tables of a logical product, a logical sum, a negation, a negative logical sum, an exclusive logical sum, etc. The configuration data of "64 bits" is inputted to each of the reconfigurable logic multiplexers 50A to 50D.

B. Creation of Wiring Function

Each reconfigurable logic multiplexer selects any one of the plurality of pieces of truth table data in accordance with the data input, by using the data input as a select signal. Each reconfigurable logic multiplexer is configured to create a desired wiring path that combines a data input from the data input line and a data output to the data output line. There are a plurality of reconfigurable logic multiplexers, and they are provided for each combination of the direction of the data input line and the direction of the data output line.

For example, the reconfigurable logic multiplexers 50A, 50B, 50C, and 50D are present for a wiring path from the left side input to the left side output, a wiring path from the left side input to the right side output, a wiring path from the right side input to the left side output, and a wiring path from the right side input to the right side output, respectively. In the case where the reconfigurable logic multiplexer 50A, instead of the reconfigurable logic multiplexer 50B, is selected by the data input, the input signal (configuration data) selected by the reconfigurable logic multiplexer 50B in accordance with the data input is "0", and the signal of 50A and the signal of 50C are logically summed; therefore, the signal from the left to the left takes precedence and forms a signal path from the left to the left. A prescribed logic value is set for the input signal (configuration data) selected by the reconfigurable logic multiplexer 50A in accordance with the data input, and the value is outputted to the left.

The reconfigurable logic multiplexers 50A and 50C are logically summed; and setting the configuration data of the reconfigurable logic multiplexer 50C to "0" can output the signals of InA0 to InA3 from the left to the left with a prescribed logic value. The reconfigurable logic multiplexers 50B and 50D are logically summed; and setting the reconfigurable logic multiplexer 50D to "0" outputs the signals of InA0 to InA3 to the right side. The signals of InB0 to InB3 are outputted to the left and right by the same method.

As described above, the reconfigurable logic multiplexer 50 is provided in accordance with the wiring path and is configured to logically operate the configuration data and select the wiring, and thereby operates like a logical operation circuit and/or a switch.

3.2 Time Chart

Figure 7:
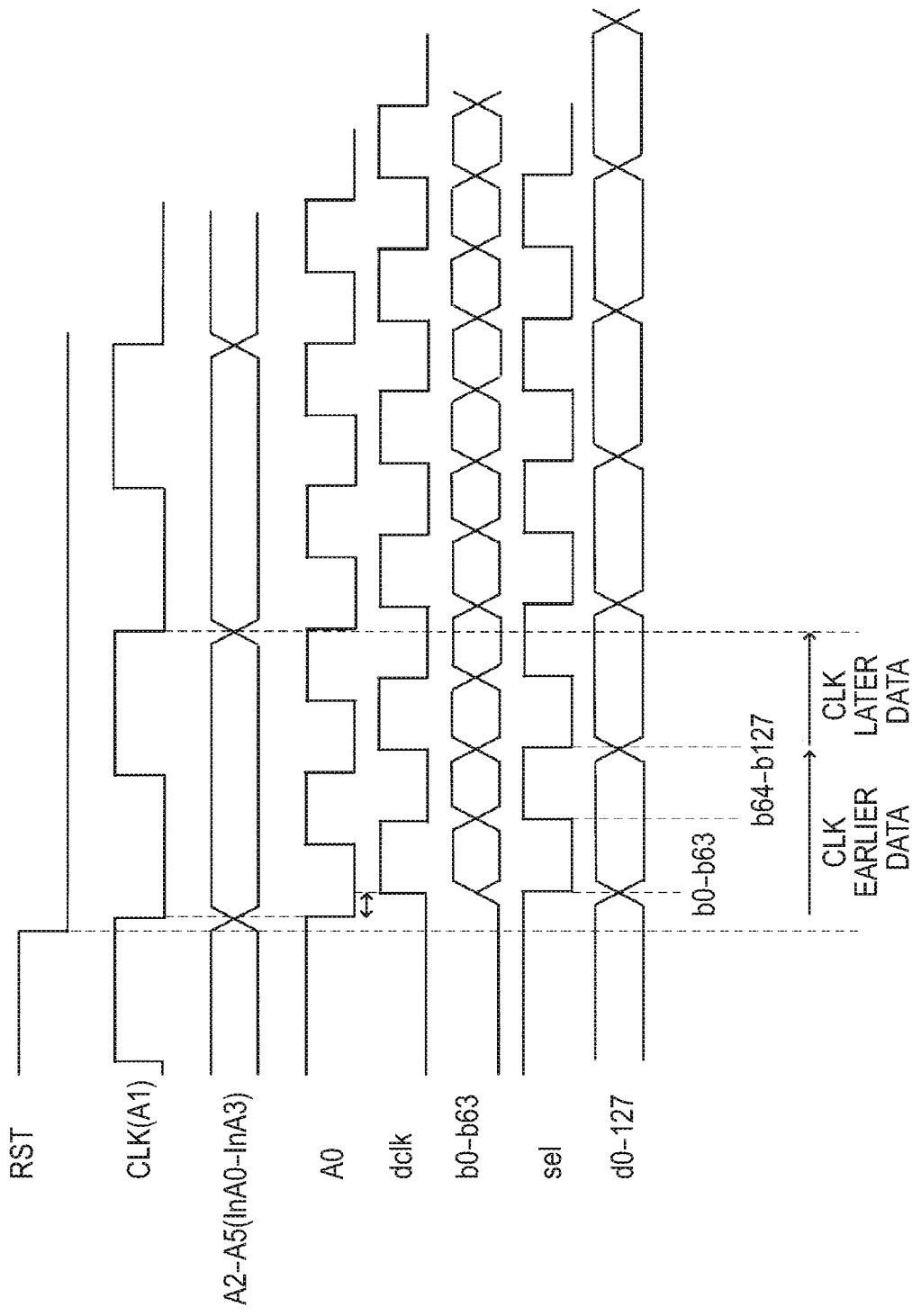
FIG. 7 is an example of a time chart of signals in the MLUT shown in FIG. 5.

FIG. 7 is a time chart of signals flowing through the MLUT shown in FIG. 5. First, the RST changes from "High" to "Low", and the operation starts.

The CLK is a system clock signal. In the embodiment, the CLK serves as the signal of the third address line A1, and is used to generate the signal of the first address line A0.

The second addresses A2 to A5 (InA0 to A3) are inputted asynchronously, and have no direct relation to the clock. However, when inputted as a synchronous signal, the second addresses A2 to A5 are affected by the input of the third address as shown in the drawing.

The first address A0 has a frequency of twice that of the third address A1.

The register clock sel has been delayed from the first address A0 by the delay circuit D in order to cause a F/F to operate at the rising of the register clock sel after a D input, since, in the same operation as that of the configuration memories 40A and 40B, the same operation as the D input does not cause the F/F to operate.

The data (b0 to b63) is read from the configuration memories 40A and 40B in accordance with the device clock dclk. The configuration memories 40A and 40B output data of each of the first address "High" and "Low" in accordance with the first address A0; but these pieces of data are integrated by the encoder function of the register units 60A and 60B, and the configuration data is outputted to the reconfigurable logic multiplexer 50.

3.3 MLUT of Four-Direction Arrangement

Figure 8:
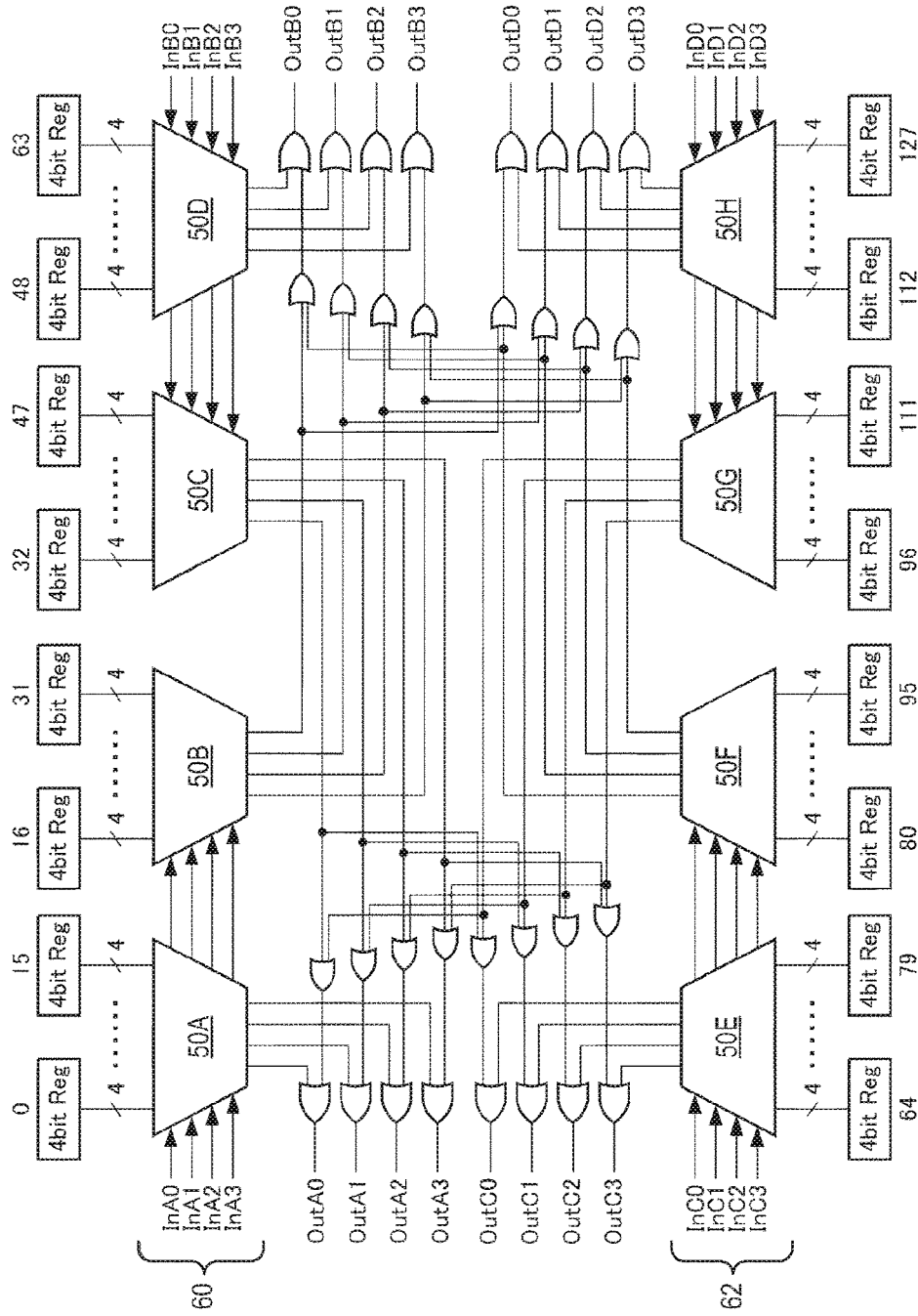
FIG. 8 is a diagram showing an example of the MLUT of the four-direction arrangement.

FIG. 8 is a diagram showing an example of the MLUT of a four-direction arrangement. Since the data input/output from the left and right is the same as that in the alternating arrangement as shown in FIG. 8, the address inputs of InA0 to InB3 are omitted. Additionally, in the MLUT of FIG. 8, there are data inputs InC0 to InC3 from the MLUT above and data outputs OutC0 to OutC3 to the MLUT above, and data inputs InD0 to InD3 from the MLUT below and data outputs OutD0 to OutD3 to the MLUT below.

Although the configuration memory is not shown, the operation of each component is the same as that of the MLUT of the alternating arrangement. Since there are four directions, the number of reconfigurable logic multiplexers is increased by four (reconfigurable logic multiplexers 50E to 50H) from that of the MLUT of the alternating arrangement.

An output of the multiplexer of the alternating arrangement is logically summed with another output in the same direction; the principle also applies to the four-direction arrangement. However, since there are outputs in four directions, a logical sum of three outputs is needed. For example, taking the data outputs OutC0 to OutC3 as an example, there is a logical sum of the outputs of the reconfigurable logic multiplexers 50C, 50E, and 50G. By setting the data of the reconfigurable logic multiplexers 50E and 50G to "0", the output of 50C can be outputted to the above.

4. Page Control

Figure 9:
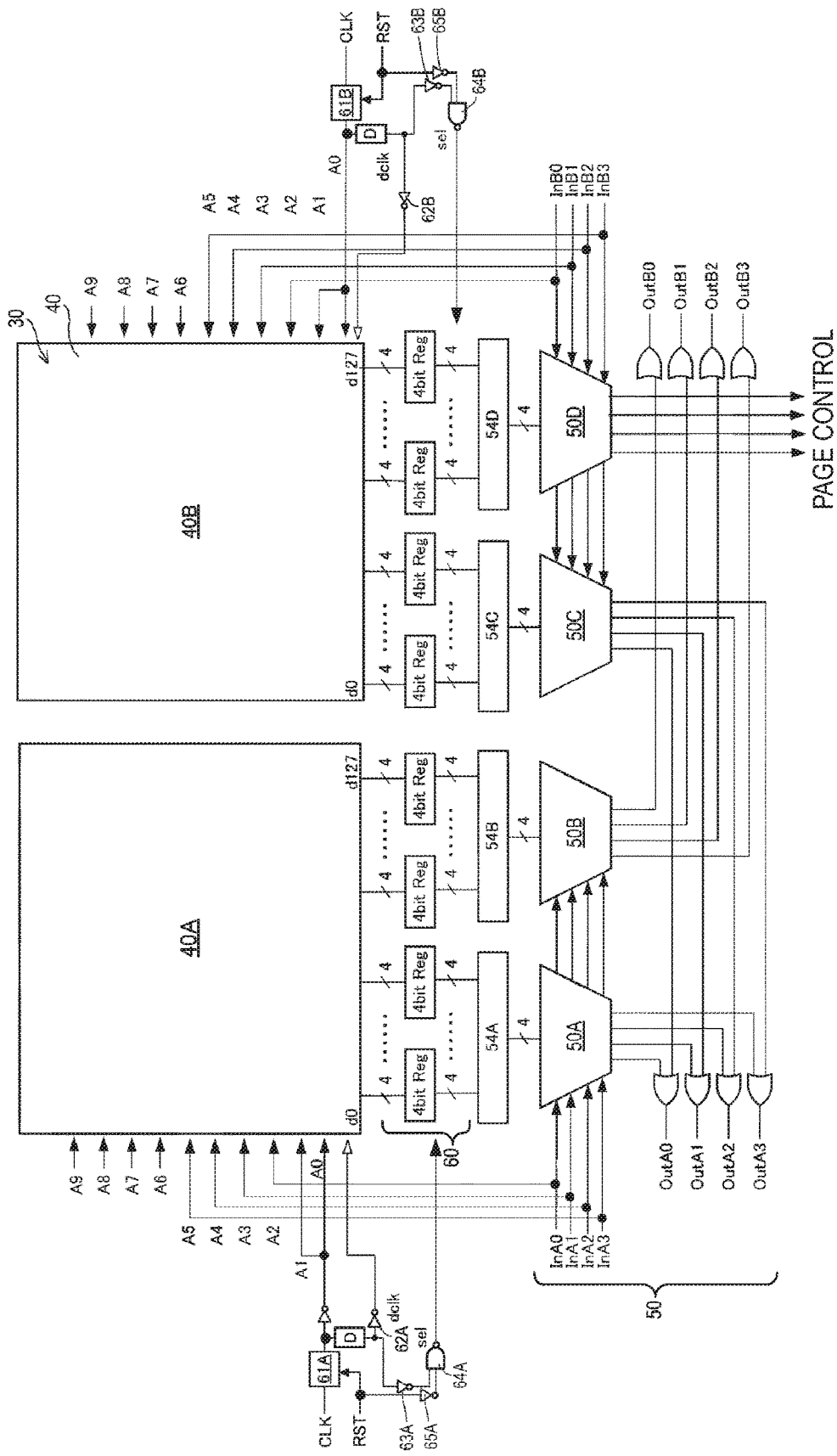
FIG. 9 is a diagram showing an example of the MLUT in which page control is performed.

FIG. 9 is a diagram showing an example of the MLUT in which page control is performed. In the MLUT in which page control is performed, a portion of the MLUT operates as a circuit that generates a page control signal of the other configuration memory, and the data output controls the page of the other configuration memory.

The MLUT 30 shown in FIG. 9 includes large-capacity memory cell units 40A and 40B, and in this example, each memory cell unit is composed of 10 address lines and 128 data lines; therefore, a large capacity of 2 raised to the 10th power (1024) words×128 bits is obtained. The memory space is divided into pages by A6 to A9, which are the fourth address described in FIG. 5; thus, multiplexing of logic can be made. Since there are 2 raised to the 4th power of words, this case is an example of 16 pages. In this example, because of the MLUT array of the alternating arrangement, clock control from the left and right is possible.

FIG. 9 is a schematic diagram, and a decoder, etc. that are peripheral circuits of the memory cell unit are not shown; as the decoder, the address decoder 120 and the configuration data input/output unit 140 described in FIG. 6 are prepared for each memory cell unit.

Figure 10:
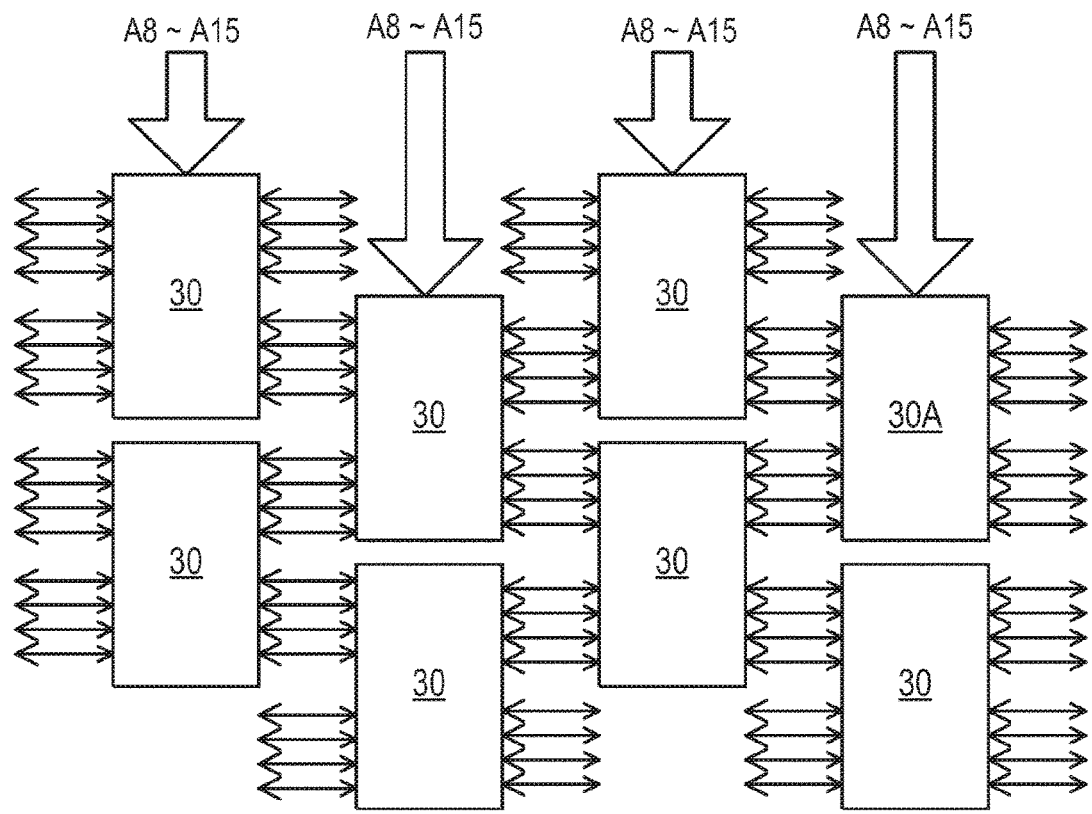
FIG. 10 is a diagram showing an example in which a state machine is provided outside the MLUTs.

FIG. 10 is a diagram showing an example in which a state machine is provided outside the MLUTs. As shown in FIG. 10, by controlling the MLUT 30 from an external system, it is possible to switch the page (truth table data) by means of the fourth address.

In conventional MPLDs, the state machine of the MPLD needs to be defined by truth table data. Hence, it is necessary to provide truth table data that defines a plurality of states determined beforehand in accordance with prescribed conditions. It is necessary to make arrangement and wiring while creating not only a state machine formed of an MLUT, which serves as a control circuit, but also a logic circuit, unlike a data path.

Figure 11:
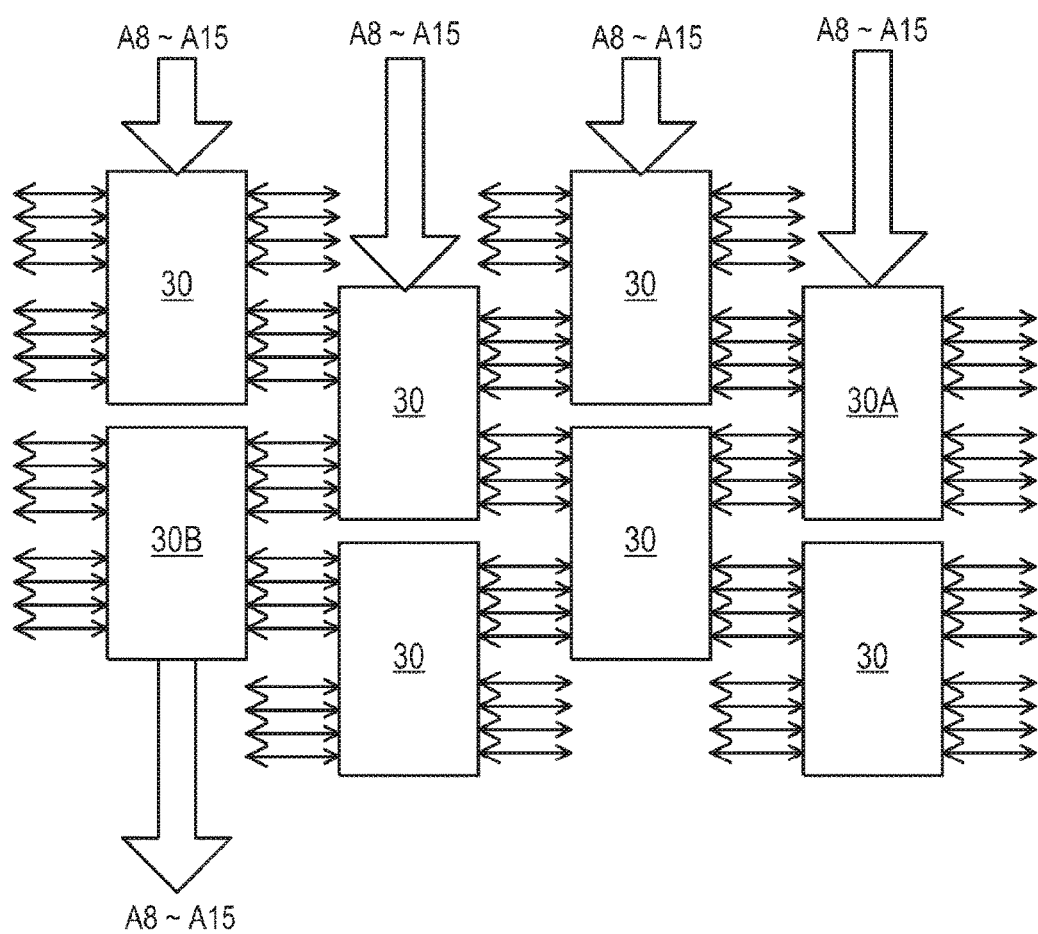
FIG. 11 is a diagram showing an example in which a state machine is provided inside the MLUTs.

FIG. 11 is a diagram showing an example in which a state machine is provided inside the MLUTs. This is an example in which a state machine is provided independently by the MRLD by using part of the configuration data. A decrement operation is performed by a circuit, etc. formed of an MLUT 30B to allow a for-control in the C language. The 0 data (the 0 address of the MLUT 30B) is made to store the address of the next page, and the other addresses are made to store the current address. This makes a for-statement control possible.

Since the MLUT 30 shown in FIG. 11 has a page switching control function, there is no need to define the state machine with a truth table. For example, in a for-statement, until a prescribed value reaches a certain condition, the addresses of the current page are outputted to the data lines to prevent page switching so that the operation is processed in the same page. When the certain condition is satisfied (e.g. i=0), the addresses for page switching are outputted to the data lines. The data line is inputted as an address line to another memory cell unit, and thereby the page switching of another memory cell unit can be made. In the case of a case-statement, depending on a prescribed value, jump addresses are outputted to the data lines to allow page switching, and thereby operation change can be made. Thus, while conventional MPLDs can perform only a logic circuit configuration, operation synthesis in the C language also becomes possible, and the truth value data of the MLUT of the MPLD can be created from the C language; and a function beyond the FPGA may be provided.

The MRLD can utilize conventional large-capacity memory devices without semiconductor designing, trial manufacturing, and manufacturing for a dedicated small-sized SRAM. When the MRLD is formed using a chip, memory intellectual property (IP) is used; but in minute memory capacities required by conventional MLUTs, the area of the address decoder and the sense amplifier is large, and the configuration ratio of the memory itself is 50% or less. This causes overhead, and reduces the efficiency. In large-capacity memories, the ratio of the address decoder and the sense amplifier is reduced, and the memory use efficiency is increased. Therefore, this example, which is matched with large-capacity memories, is effective in the case of MRLD chips.

5. Configuration Data

Figure 12:
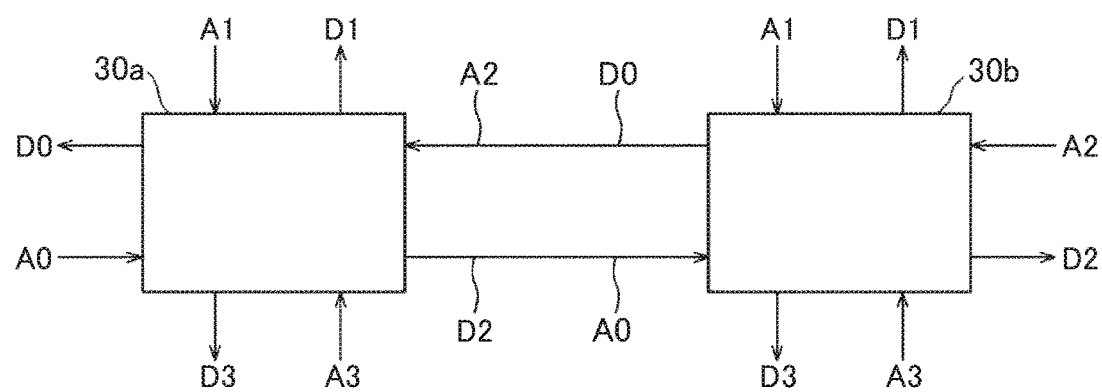
FIG. 12 is a diagram showing an example of the MLUTs.

Configuration data will now be described using examples.
5 Logical Operation of MLUT FIG. 12 is a diagram showing an example of the MLUT. The MLUTs 30A and 30B shown in FIG. 12 are connected to four logical address input LA lines A0 to A3 and four logical operation data lines D0 to D3. The logical address input LA line A2 of the MLUT 30A is connected to the logical operation data line D0 of the adjacent MLUT 30B, and the MLUT 30A receives the data for logical operation outputted from the MLUT 30B as a logical address input LA. The logical operation data line D2 of the MLUT 30A is connected to the logical address input LA line A0 of the MLUT 30B, and the data for logical operation outputted by the MLUT 30A is received as a logical address input LA by the MLUT 30B. Such linkage between MLUTs is called an "AD pair" because of using an address line and a data line that form a pair.

The configuration data (truth table data) for creating the circuit configurations described below using an MLUT is that of the MLUT 30A or 30B shown in FIG. 12.

A. Configuration of Logic Circuit

Figure 13:
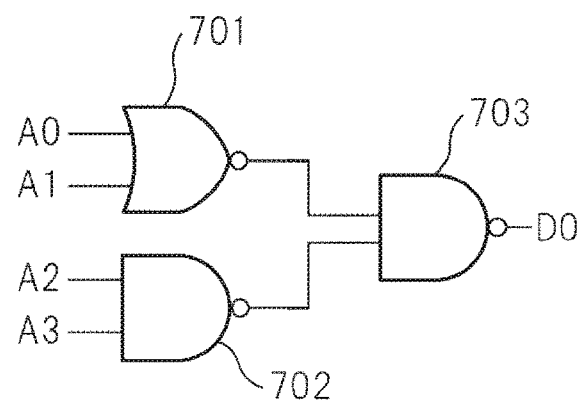
FIG. 13 is a diagram showing an example of the MLUT that operates as a logic circuit.

FIG. 13 is a diagram showing an example of the MLUT that operates as a logic circuit. In this example, a logic circuit is formed in which the logical address input LA lines A0 and A1 are used as the inputs of a two-input NOR circuit 701, and the logical address input LA lines A2 and A3 are used as the inputs of a two-input NAND circuit 702, and outputs of the two-input NOR circuit 701 and the output of the two-input NAND circuit 702 are inputted to a two-input NAND circuit 703, and the output of the two-input NAND circuit 703 is outputted to the logical operation data line D0.

Figures 14, 15, 16:
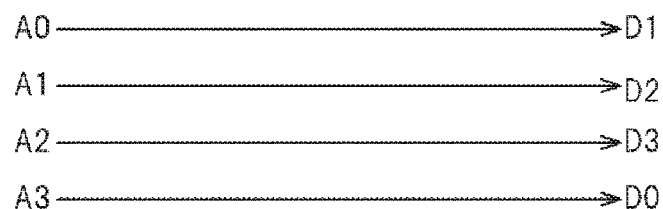
FIG. 14 is a diagram showing a truth table of the logic circuit shown in FIG. 13.
FIG. 15 is a diagram showing an example of the MLUT that operates as a connection circuit.
FIG. 16 is a diagram showing a truth table of the connection circuit shown in FIG. 15.

FIG. 14 is a diagram showing the truth table of the logic circuit shown in FIG. 13. The logic circuit of FIG. 13 has four inputs, and therefore uses all the inputs A0 to A3 as the inputs. Meanwhile, there is only one output, and therefore only the output D0 is used as the output. The symbol "*" is written in the fields of the outputs D1 to D3 of the truth table. This means that either the value "0" or "1" is possible. However, when the truth table data is actually written to the MLUT for reconfiguration, it is necessary to write any one of the values "0" and "1" in these fields.

B. Configuration of Connection Circuit

FIG. 15 is a diagram showing an example of the MLUT that operates as a connection circuit. In FIG. 15, the MLUT serving as a connection circuit operates to output the signal of the logical address input LA line A0 to the logical operation data line D1, output the signal of the logical address input LA line A1 to the logical operation data line D2, and output the signal of the logical address input LA line A2 to the logical operation data line D3. The MLUT serving as a connection circuit further operates to output the signal of the logical address input LA line A3 to the logical operation data line D0.

FIG. 16 is a diagram showing the truth table of the connection circuit shown in FIG. 15. The connection circuit shown in FIG. 15 has four inputs and four outputs. Therefore, all the inputs A0 to A3 and all the outputs D0 to D3 are used. The truth table shown in FIG. 16 operates the MLUT as a connection circuit that outputs the signal of the input A0 to the output D1, outputs the signal of the input A1 to the output D2, outputs the signal of the input A2 to the output D3, and outputs the signal of the input A3 to the output D0.

C. Configuration of Logic Circuit and Connection Circuit

Figures 17, 18:
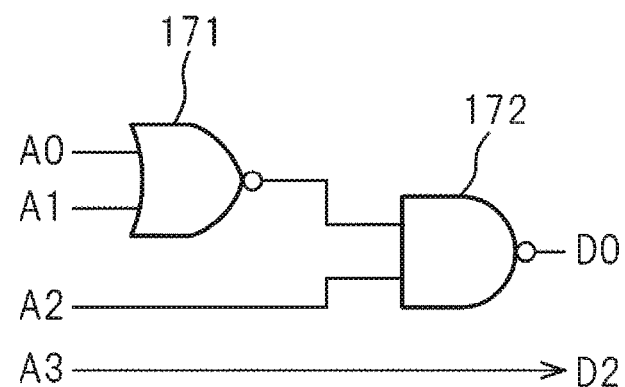
FIG. 17 is a diagram showing an example in which one MLUT operates as a logic circuit and a connection circuit.
FIG. 18 is a diagram showing a truth table of the logic circuit and the connection circuit shown in FIG. 17.

FIG. 17 is a diagram showing an example in which one MLUT operates as a logic circuit and a connection circuit. In the example shown in FIG. 17, a logic circuit is formed in which logical address input LA lines A0 and A1 are used as the inputs of a two-input NOR circuit 171, the output of the two-input NOR circuit 171 and the logical address input LA line A2 are used as the inputs of a two-input NAND circuit 172, and the output of the two-input NAND circuit 172 is outputted to the logical operation data line D0. At the same time, a connection circuit is formed in which the signal of the logical address input LA line A3 is outputted to the logical operation data line D2.

FIG. 18 shows the truth table of the logic circuit and the connection circuit shown in FIG. 17. The logical operation of FIG. 17 uses the three inputs A0 to A2 as the inputs and uses the one output D0 as the output. Meanwhile, in the connection circuit of FIG. 18, a connection circuit is formed in which the signal of the input A3 is outputted to the output D2.

D. Sequential Circuit Function

The operation of a sequential circuit cannot be described by the truth table data itself retained in the configuration memory, unlike a combinational circuit. Hence, the sequential circuit is created using the function of the register unit 60.

A D-type flip-flop constructs the following truth table for the output from the configuration memory.

TABLE 1

| D (output from configuration memory) | Clock | Q of next state |
| --- | --- | --- |
| 0 | Rising | 0 |
| 1 | Rising | 1 |
| X | Falling | Retain Q of previous state |

Figure 19:
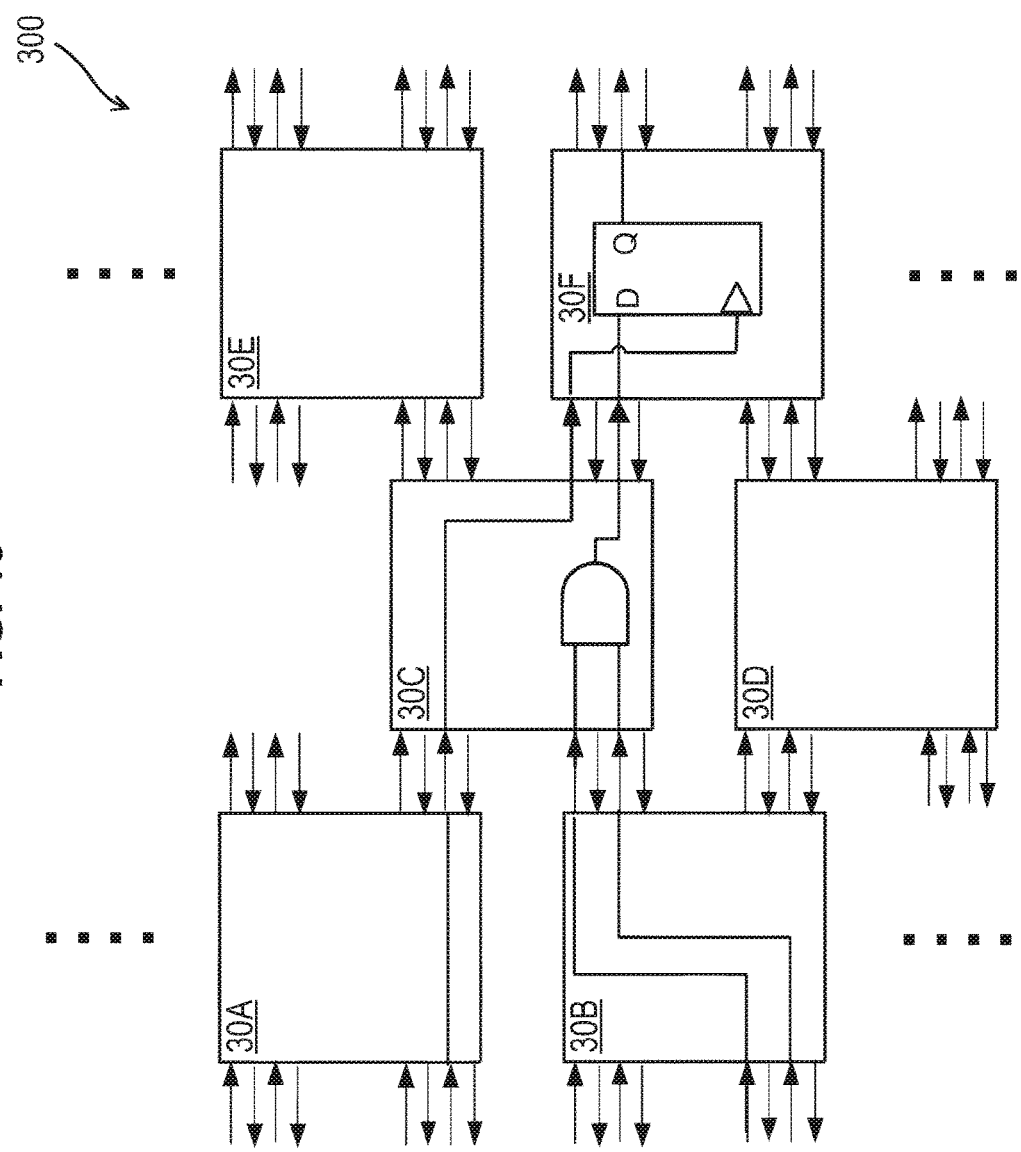
FIG. 19 is a diagram showing a logic circuit and a wiring formed by the MLUTs of the alternating arrangement described in FIG. 2.

In FIG. 19 described below, a D-type flip-flop is shown in an MLUT 30F.

FIG. 19 is a diagram showing a logic circuit and a wiring formed of the MLUTs of the alternating arrangement described in FIG. 2. In FIG. 19, the MLUTs of the alternating arrangement described in FIG. 2 are formed, and each is formed of two configuration memories (left side and right side). As illustrated in FIG. 19, the logic circuit and the wiring are formed of MLUTs 30A to 30F. The MLUT 30C is an MLUT that forms the logic circuit and the connection circuit described in FIG. 17; and in the MLUT 30F, the flip-flop shown in Table 1 is created by the register unit 60. FIG. 20A to FIG. 20J described below also include truth table data selected by page control.

Figure 20A:
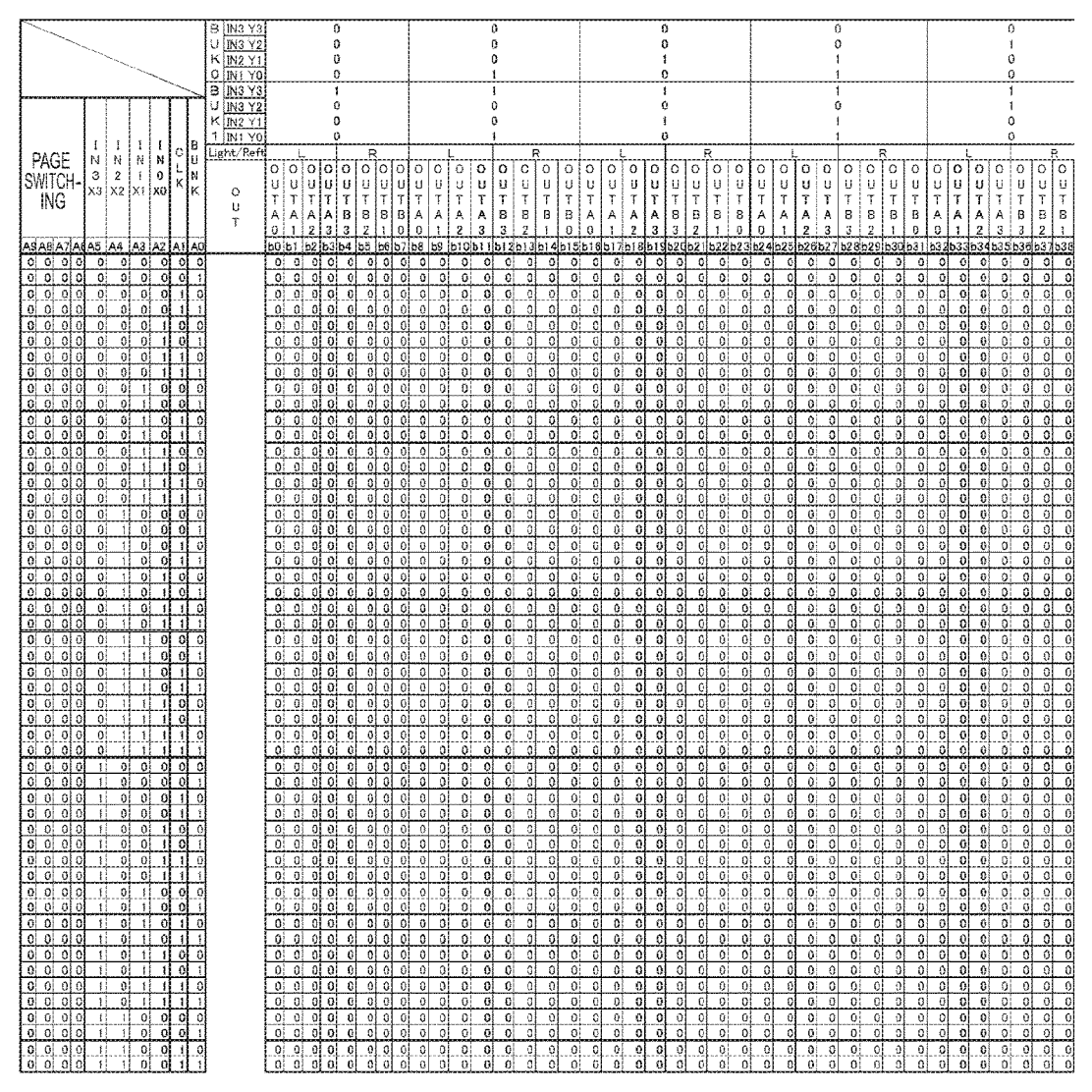
Figure 20B:
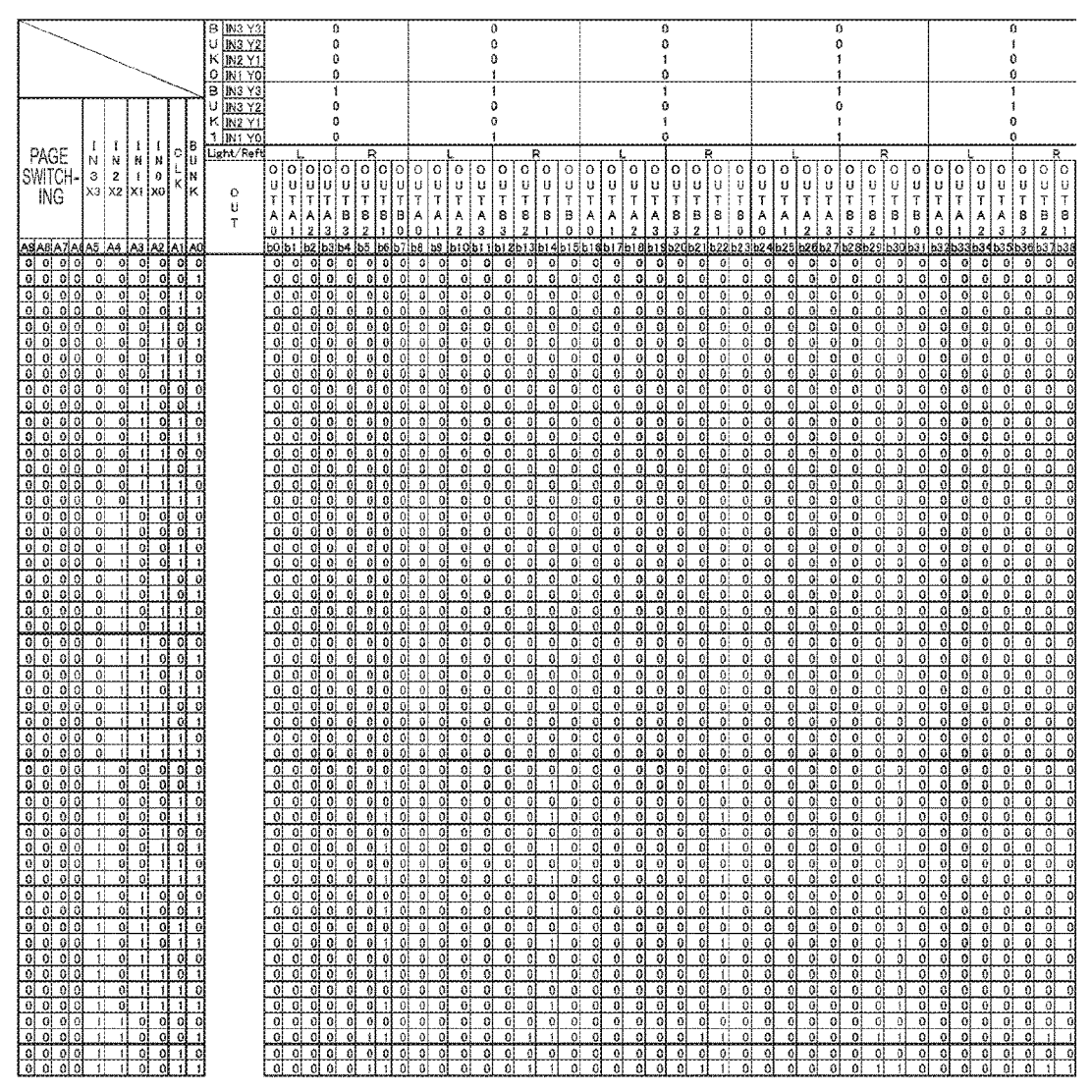
Figure 20C:
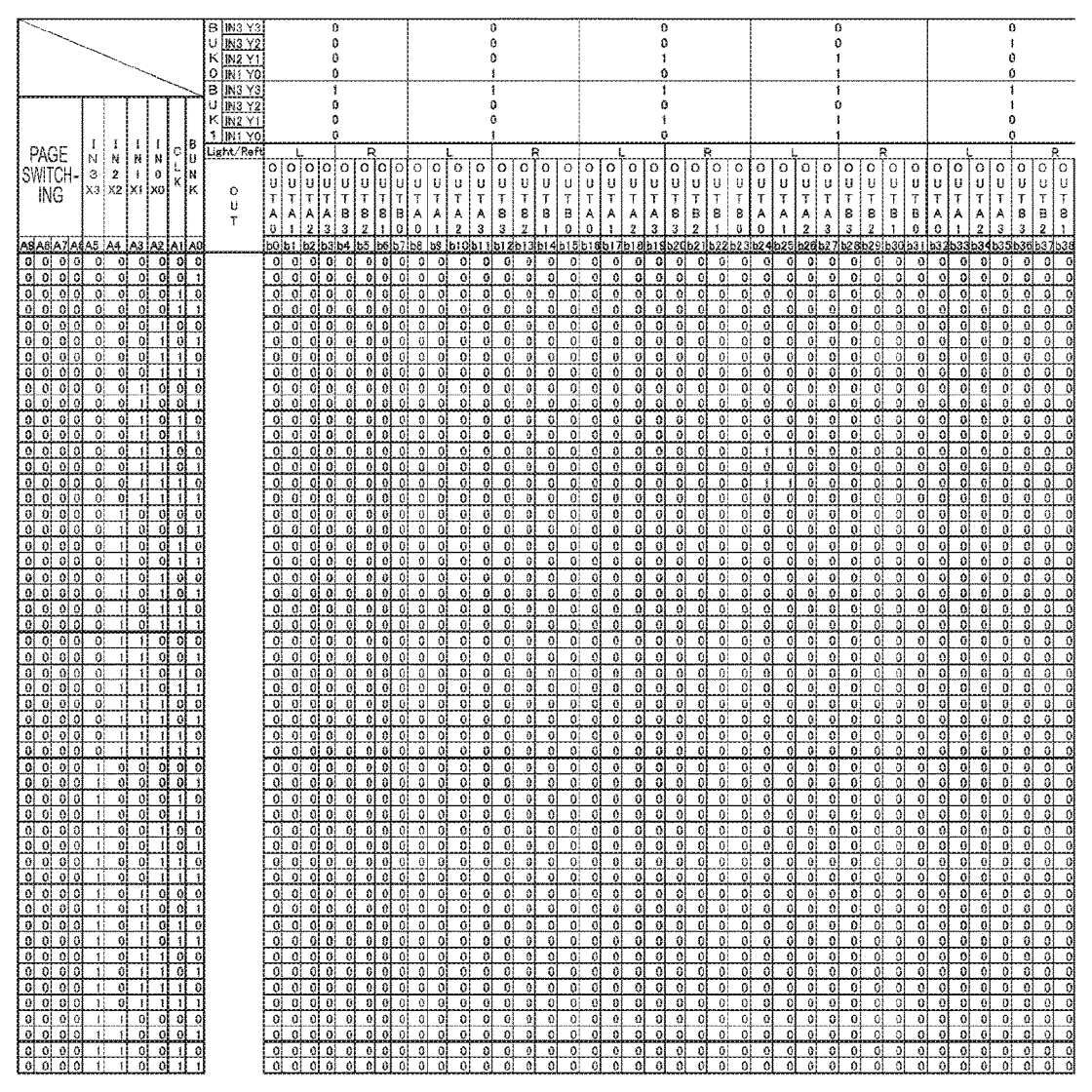
Figure 20D:
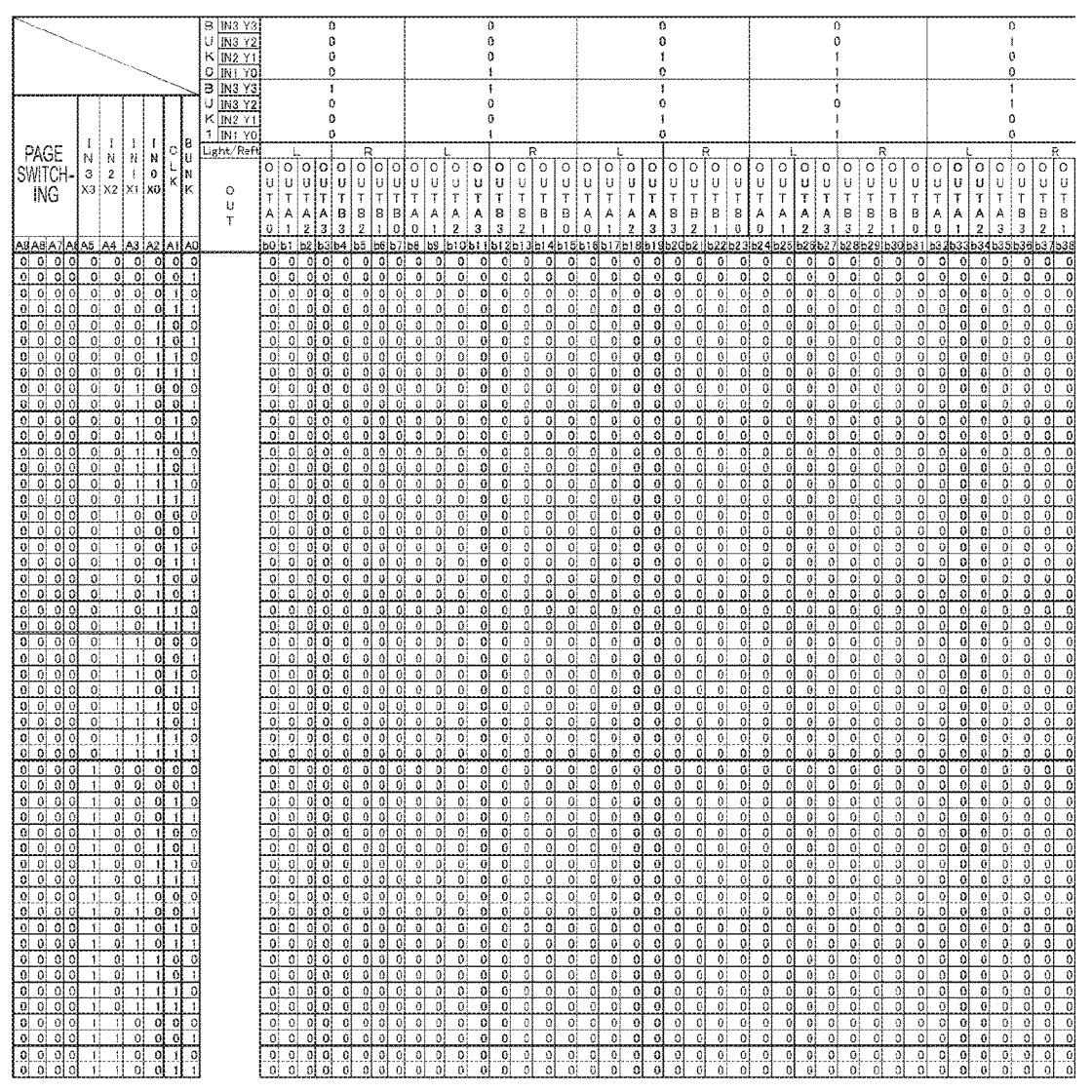
Figure 20E:
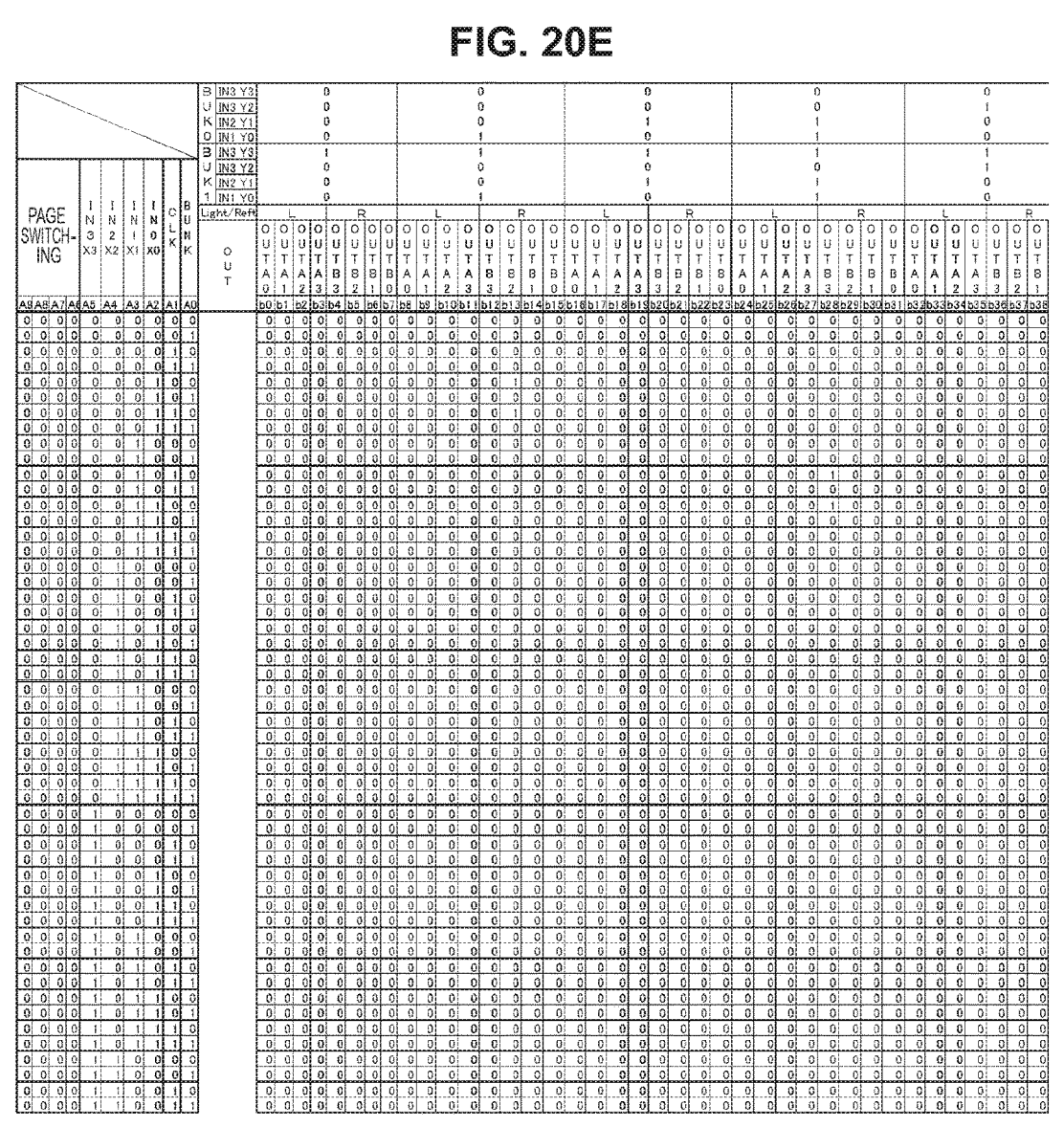
Figure 20F:
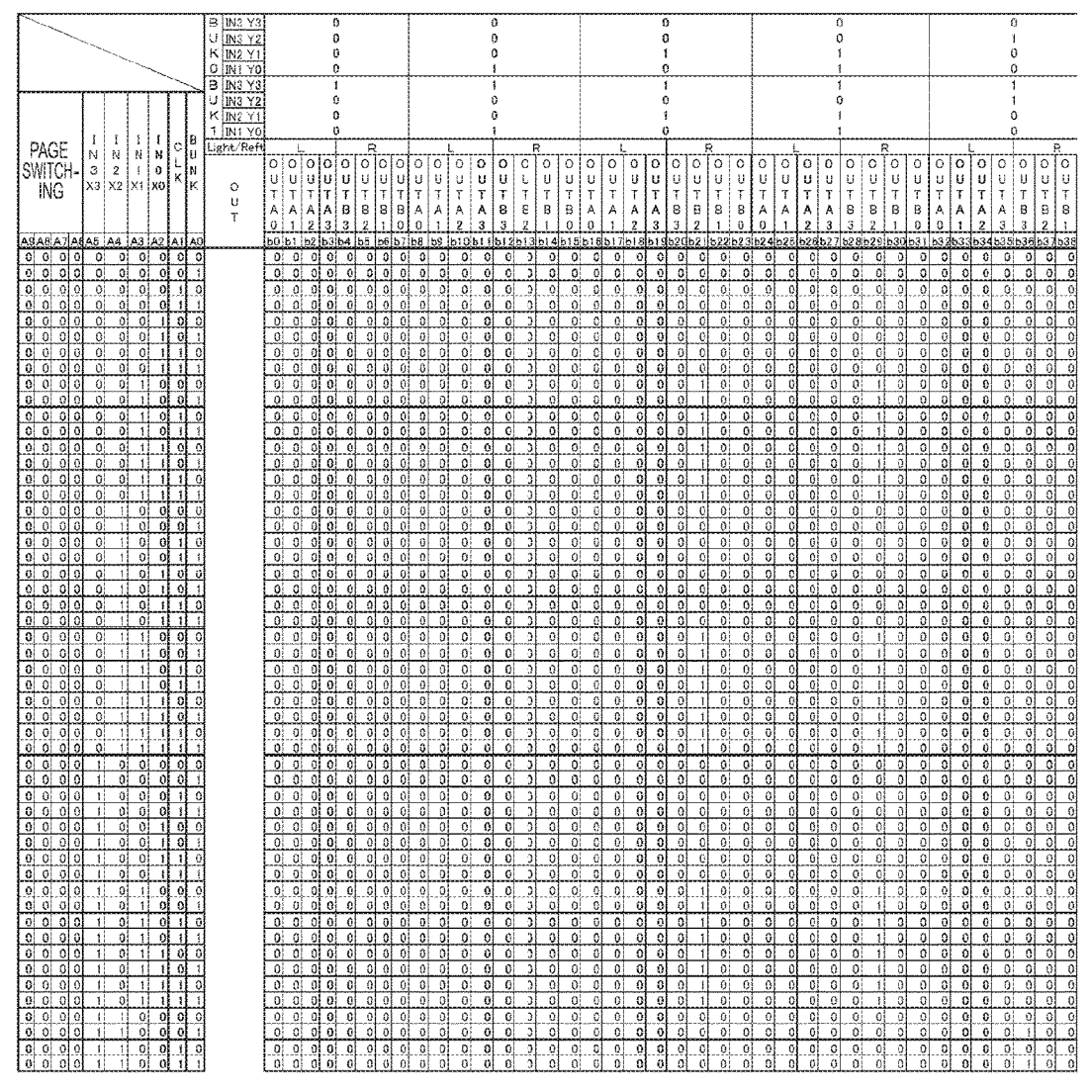

FIG. 20A is a diagram showing an example of the configuration data stored in the configuration memory on the left side of the MLUT 30A. FIG. 20B is a diagram showing an example of the configuration data stored in the configuration memory on the right side of the MLUT 30A. FIG. 20C is a diagram showing an example of the configuration data stored in the configuration memory on the left side of the MLUT 30B. FIG. 20D is a diagram showing an example of the configuration data stored in the configuration memory on the right side of the MLUT 30B. FIG. 20E is a diagram showing an example of the configuration data stored in the configuration memory on the left side of the MLUT 30C. FIG. 20F is a diagram showing an example of the configuration data stored in the configuration memory on the right side of the MLUT 30C.

Figure 20G:
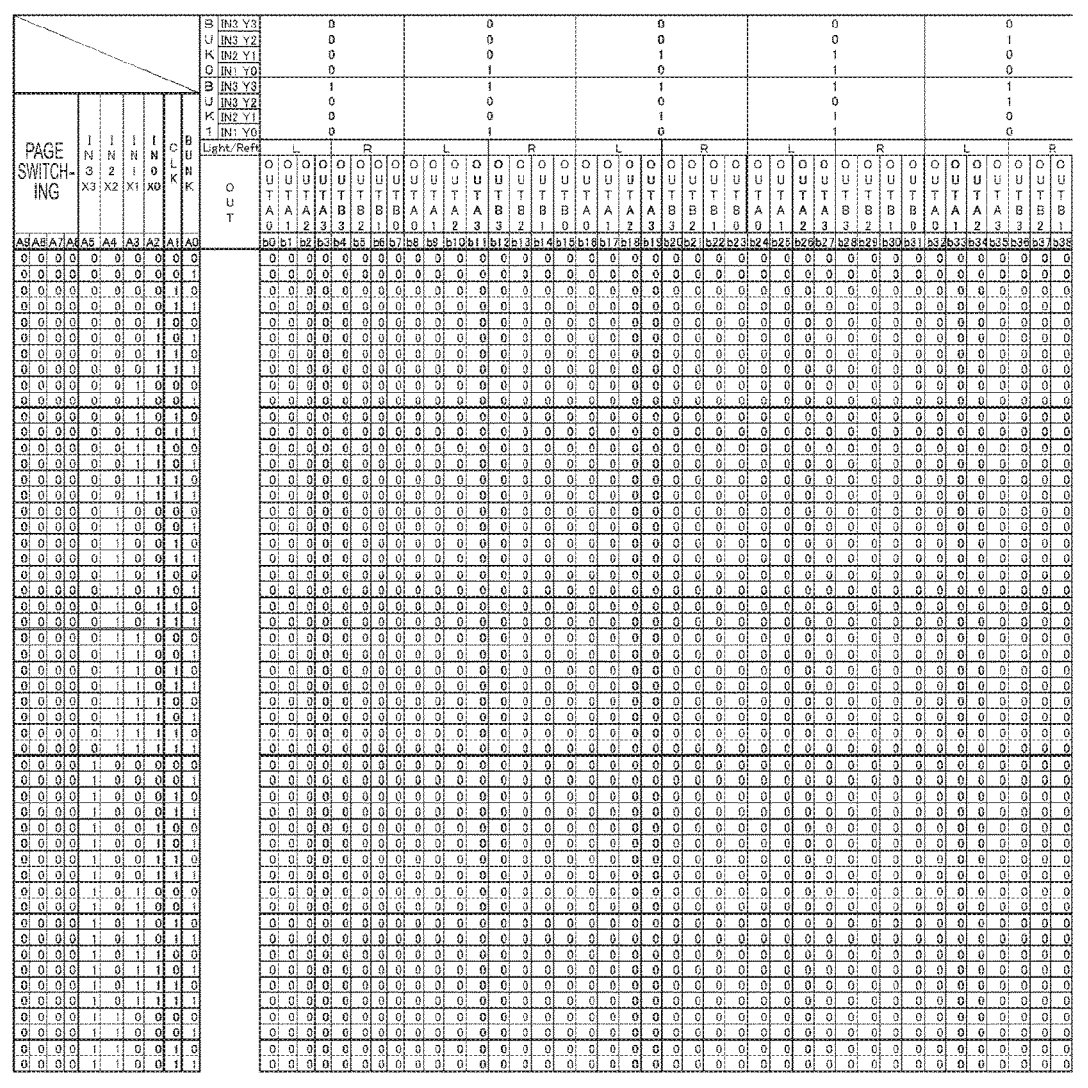
Figure 20H:
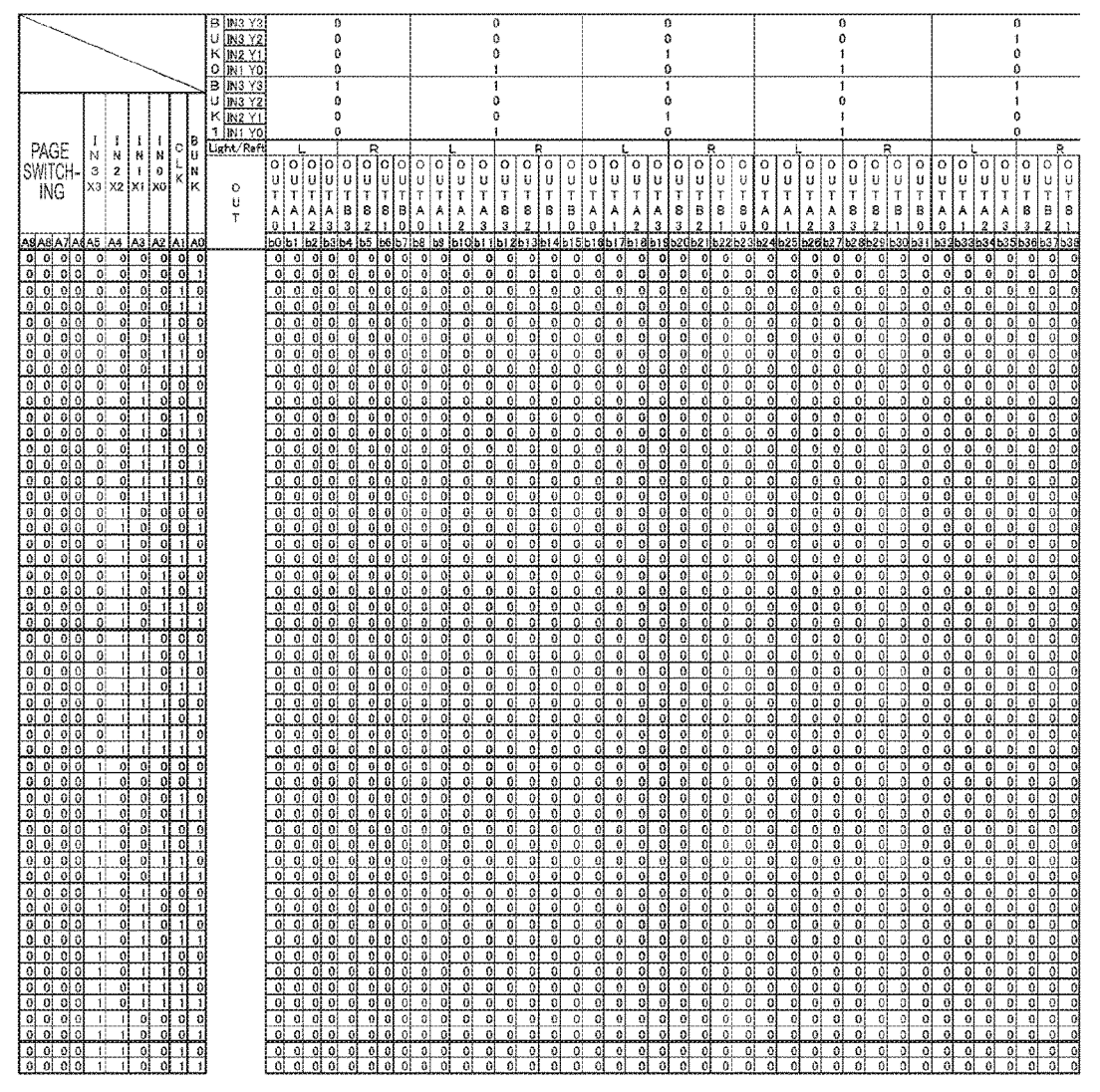
Figure 20I:
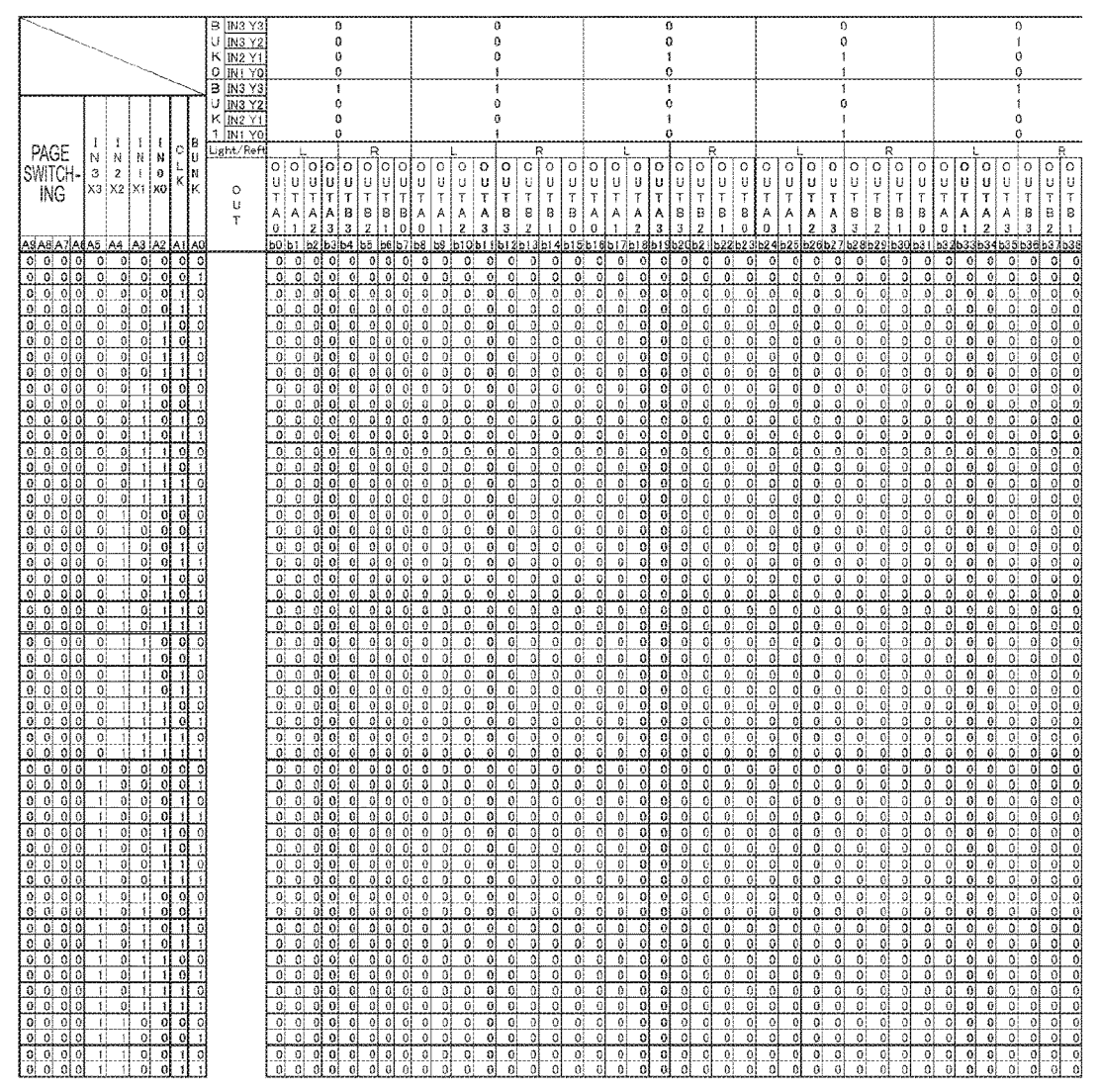
Figure 20J:
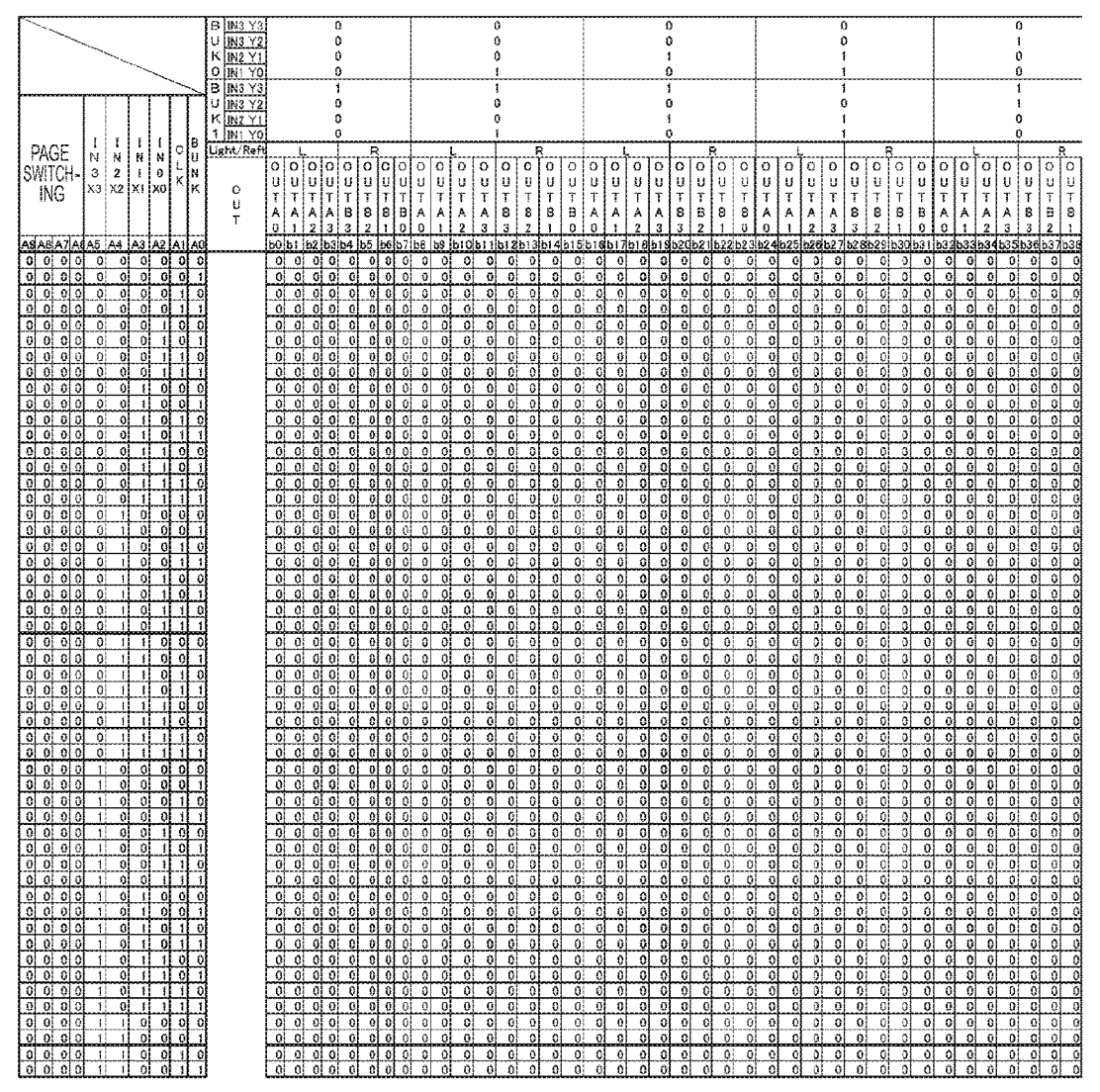
Figure 20K:
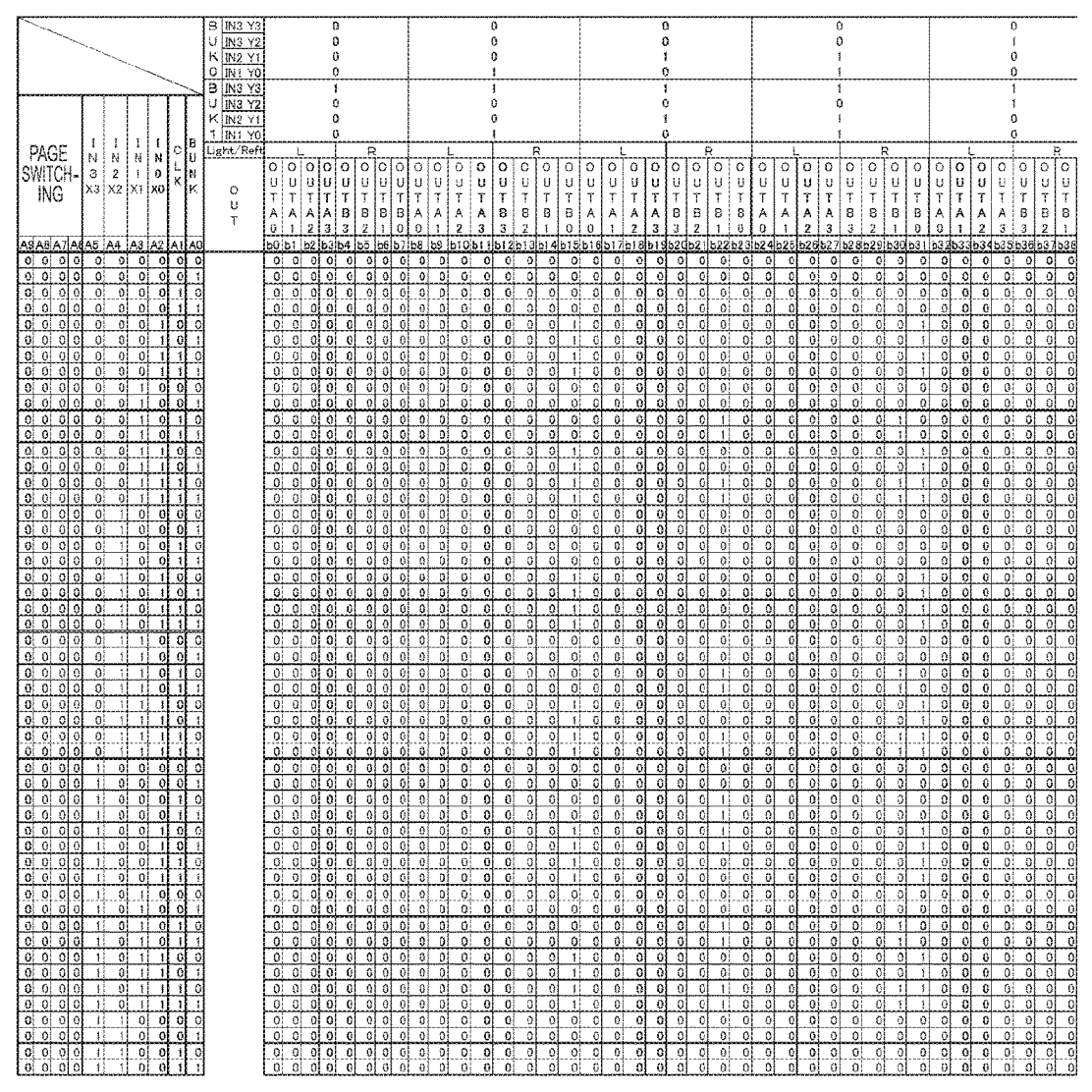
Figure 20L:
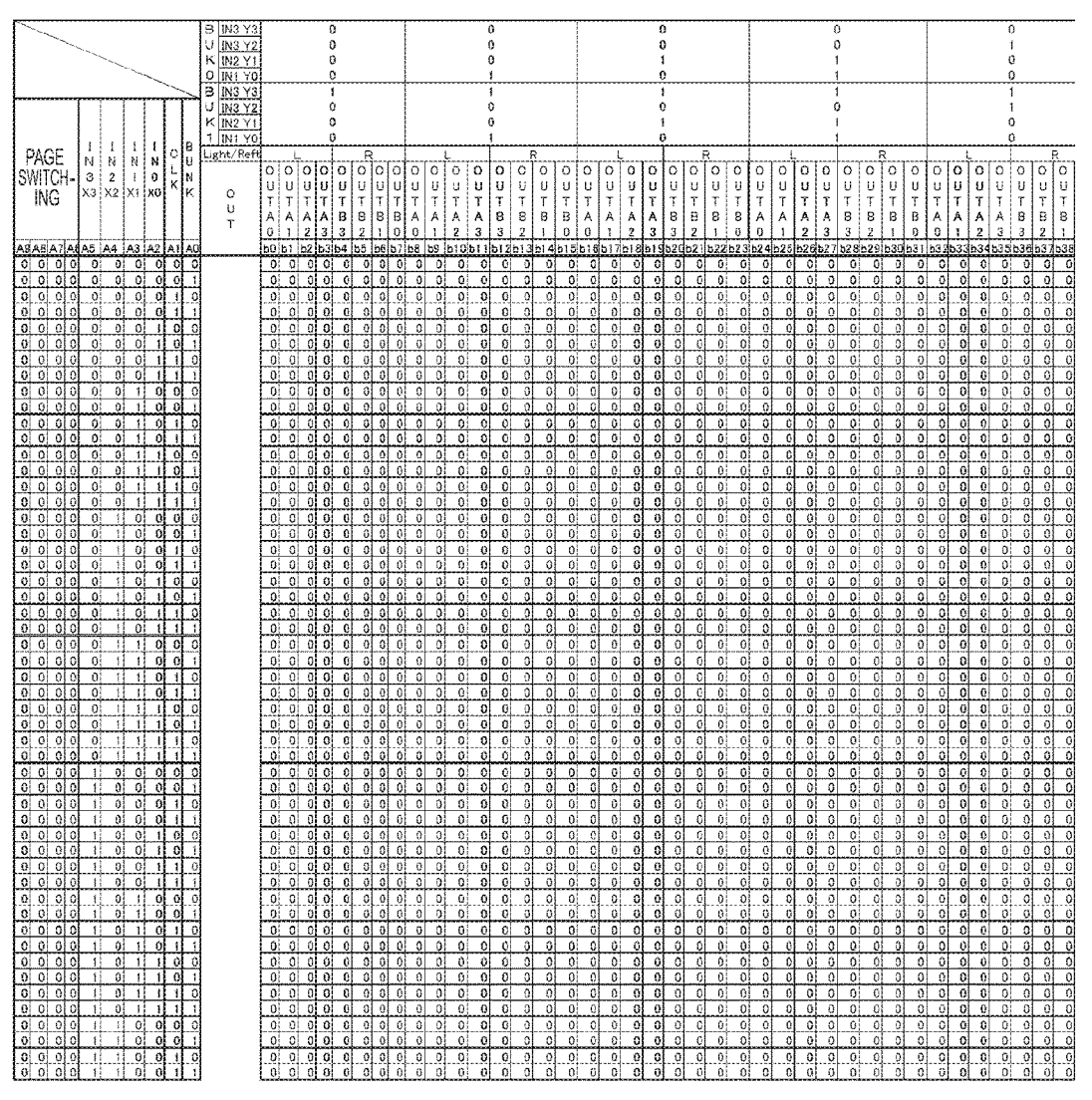

FIG. 20G is a diagram showing an example of the configuration data stored in the configuration memory on the left side of the MLUT 30D. FIG. 20H is a diagram showing an example of the configuration data stored in the configuration memory on the right side of the MLUT 30D. FIG. 20I is a diagram showing an example of the configuration data stored in the configuration memory on the left side of the MLUT 30E. FIG. 20J is a diagram showing an example of the configuration data stored in the configuration memory on the right side of the MLUT 30E. FIG. 20K is a diagram showing an example of the configuration data stored in the configuration memory on the left side of an MLUT 30F. FIG. 20L is a diagram showing an example of the configuration data stored in the configuration memory on the right side of the MLUT 30F.

Since the outputs of reconfigurable logic multiplexers are logically summed as described above, the configuration data is configured such that a result of a desired logical operation is outputted by setting the configuration data of a path with no signal output to "0". Since the clock of the data selector is prohibited by the CLK input "Low (0)", the data of the data selector is retained and an F/F is created.

6. Method for Creating Truth Table Data

The truth table data of a reconfigurable semiconductor device is created by an information processing device that executes a software program for logic configuration.

Figure 21:
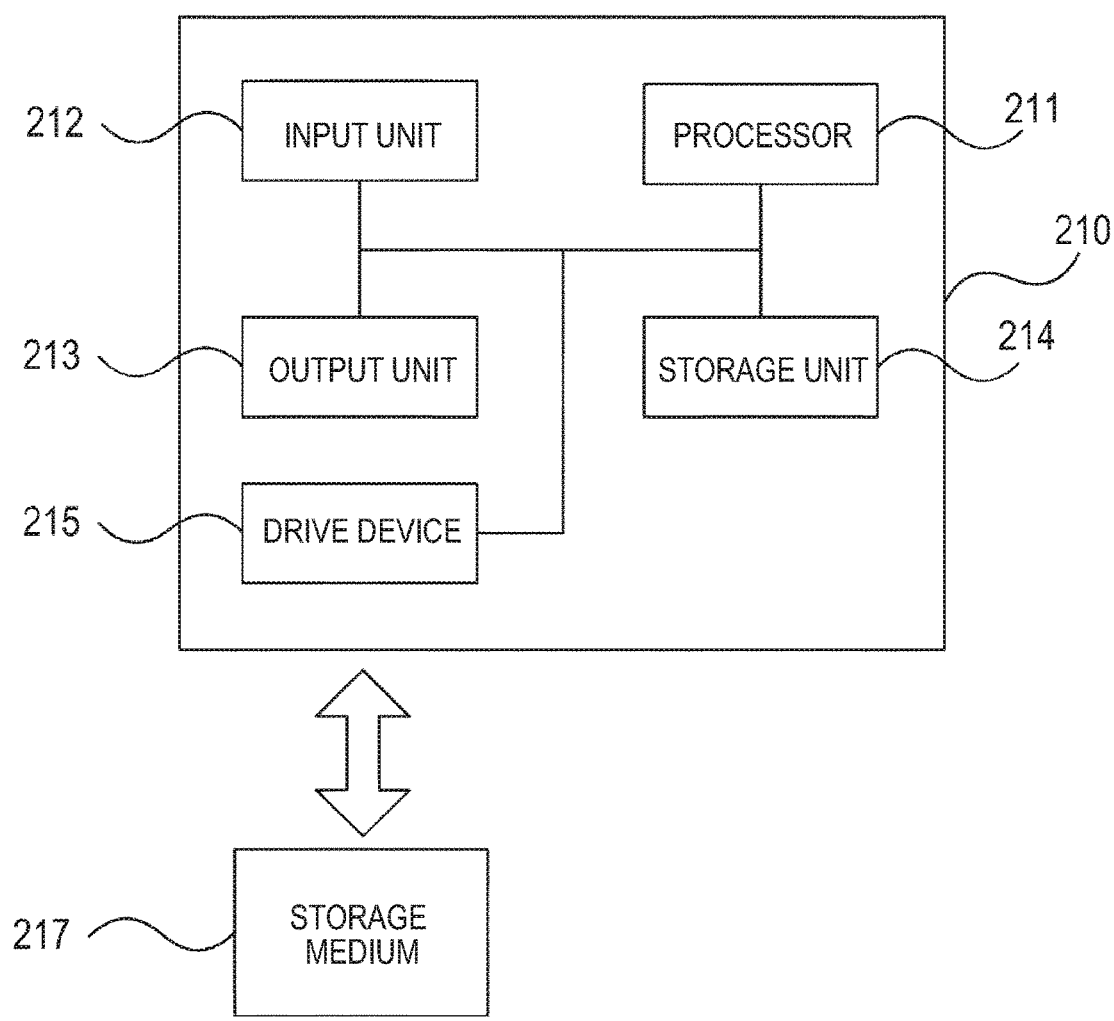
FIG. 21 is a diagram showing a hardware configuration of an information processing device that creates truth table data.

FIG. 21 shows an example of the hardware configuration of an information processing device. An information processing device 210 includes a processor 211, an input unit 212, an output unit 213, a storage unit 214, and a drive device 215. The processor 211 stores, in the storage unit 214, software for arrangement and wiring inputted to the input unit 212, a circuit description language such as a C language description and a hardware description language (HDL), for designing an integrated circuit, and truth table data created by executing the software mentioned above. The processor 211 executes the software for arrangement and wiring to perform the processing of arrangement and wiring described below for the circuit description stored in the storage unit 214, and outputs truth table data to the output unit 213. The MRLD 20 can be connected to the output unit 213; and the processor 211 executes logic configuration processing, and writes the created truth table data to the MRLD 20 via the output unit 213. The output unit 213 may be connected to an external network. In this case, the software program for logic configuration is transmitted and received via the network. The drive device 215 is a device that performs reading and writing from and to a storage medium 217 such as a digital versatile disc (DVD) or flash memory. The drive device 215 includes a motor that rotates the storage medium 217, and a head that performs reading and writing of data on the storage medium 217. The storage medium 217 can store a program for logic configuration, or truth table data. The drive device 215 reads a program from the inserted storage medium 217. The processor 211 stores the program or the truth table data read by the drive device 215 in the storage unit 214.

Truth table data is read by the MRLD 20, thereby constructing a function as a logic circuit and/or a connection circuit through a specific means in which truth table data and hardware resources cooperate. The truth table data can be regarded as data having a logical structure, namely, a truth table.

Heretofore, preferred embodiments of the present invention have been described in detail with reference to the appended drawings, but the present invention is not limited thereto. It should be understood by those skilled in the art that various changes and alterations may be made without departing from the spirit and scope of the appended claims.

What is claimed is:
1. A reconfigurable logic device, comprising:
    a plurality of logic units,
    wherein the reconfigurable logic device is configured to allow a plurality of logic circuits to be formed in accordance with configuration data, wherein each of the plurality of logic units includes:
    a configuration memory configured to store first configuration data and second configuration data,
    a data input line,
    a data output line,
    a first address input line through which a clock is inputted as a first address for the configuration memory,
    a second address input line through which an input of the data input line is inputted as a second address for the configuration memory,
    a register unit configured to, in accordance with the clock, read the second configuration data specified by the first address from the configuration memory and retain the second configuration data, and output the first configuration data retained in a previous state, and
    a reconfigurable logic multiplexer configured to, in accordance with the first configuration data or the second configuration data outputted from the register unit, selectively combine a data input from the data input line and a data output to the data output line, and/or output, to the data output line, data produced by a logical operation related to a data input from the data input line, and
    wherein adjacent logic units are connected by the data input line and the data output line.
2. The reconfigurable logic device according to claim 1, wherein the first address is a signal obtained by multiplying a frequency of a system clock by n (n being an integer of 2 or more), wherein each of the logic units further includes a third address input line through which the system clock is inputted as a third address for the configuration memory, and wherein the register unit reads data from the configuration memory in each of an earlier period and a later period of the first address and encodes the data, and outputs the encoded data to the reconfigurable logic multiplexer.

3. The reconfigurable logic device according to claim 1, wherein the logic unit is a multi look-up table.

4. The reconfigurable logic device according to claim 1, wherein the first configuration data and the second configuration data each include a plurality of pieces of truth table data that determine a logical operation value and/or a line linkage path and are configured such that any one of the plurality of pieces of truth table data is selected in accordance with the data input.

5. The reconfigurable logic device according to claim 1, wherein a plurality of the reconfigurable logic multiplexers are present and each is provided for each combination of a direction of the data input line and a direction of the data output line.

6. The reconfigurable logic device according to claim 1, wherein the configuration memory is prepared for each data output direction.

7. The reconfigurable logic device according to claim 1, wherein each of the logic units further includes a fourth address input line through which a fourth address for the configuration memory is inputted, and wherein the configuration memory stores a plurality of sets of the first configuration data or the second configuration data and is configured such that any one of the plurality of sets of the first configuration data or the second configuration data is outputted to a fourth data output line connected to the fourth address input line and the plurality of pieces of truth table data are specified in accordance with an input of the fourth address input line.

8. A control method for a reconfigurable logic device, including:
a plurality of logic units,
wherein the reconfigurable logic device is configured to allow a plurality of logic circuits to be formed in accordance with configuration data, each of the plurality of logic units including:
a configuration memory configured to store first configuration data and second configuration data,
a data input line,
a data output line,
a first address input line through which a clock is inputted as a first address for the configuration memory,
a second address input line through which an input of the data input line is inputted as a second address for the configuration memory,
a register unit configured to retain the first configuration data or the second configuration data, and
a reconfigurable logic multiplexer, the control method comprising:
connecting adjacent logic units by the data input line and the data output line;
reading, by the register unit, in accordance with the clock, the second configuration data specified by the first address from the configuration memory and retaining the second configuration data, and outputting the first configuration data retained in a previous state; and
selectively combining, by the reconfigurable logic multiplexer, in accordance with the first configuration data or the second configuration data outputted from the register unit, a data input from the data input line and a data output to the data output line, and/or outputting, to the data output line, data produced by a logical operation related to a data input from the data input line.

9. The control method according to claim 8,
wherein the first address is a signal obtained by multiplying a frequency of a system clock by n (n being an integer of 2 or more),
wherein each of the logic units further includes a third address input line through which the system clock is inputted as a third address for the configuration memory, and
wherein the register unit reads data from the configuration memory in each of an earlier period and a later period of the first address and encodes the data, and outputs the encoded data to the reconfigurable logic multiplexer.

10. The control method according to claim 8, wherein the logic unit is a multi look-up table.

11. A non-transitory computer-readable medium configured to store computer-executable instructions for controlling a reconfigurable logic device including:
a plurality of logic units,
wherein the reconfigurable logic device is configured to allow a plurality of logic circuits to be formed in accordance with configuration data, each of the logic units including:
a configuration memory configured to store first configuration data and second configuration data,
a data input line,
a data output line,
a first address input line through which a clock is inputted as a first address for the configuration memory,
a second address input line through which an input of the data input line is inputted as a second address for the configuration memory,
a register unit configured to retain the first configuration data or the second configuration data, and
a reconfigurable logic multiplexer, the computer-executable instructions causing the reconfigurable logic device to execute operations, comprising:
connecting adjacent logic units by the data input line and the data output line;
reading, by the register unit, in accordance with the clock, the second configuration data specified by the first address from the configuration memory and retaining the second configuration data, and outputting the first configuration data retained in a previous state; and
selectively combining, by the reconfigurable logic multiplexer, a data input from the data input line and a data output to the data output line, and/or outputting, to the data output line, data produced by a logical operation related to a data input from the data input line.

* * * * *

UNITED STATES PATENT AND TRADEMARK OFFICE
CERTIFICATE OF CORRECTION

| | | |
|---|---|---|
| PATENT NO. | : 9,628,084 B2 | |
| APPLICATION NO. | : 15/046777 | |
| DATED | : April 18, 2017 | |
| INVENTOR(S) | : Masayuki Satou and Isao Shimizu | |

It is certified that error appears in the above-identified patent and that said Letters Patent is hereby corrected as shown below:

On the Title Page

Under Item (22), "Filed: Mar. 8, 2016" should be --Filed: Feb. 18, 2016--

Signed and Sealed this
Twenty-ninth Day of August, 2017

Joseph Matal
*Performing the Functions and Duties of the*
*Under Secretary of Commerce for Intellectual Property and*
*Director of the United States Patent and Trademark Office*